United States Patent [19]

Motegi et al.

[11] Patent Number: 5,059,838
[45] Date of Patent: Oct. 22, 1991

[54] SIGNAL DELAY CIRCUIT USING CHARGE PUMP CIRCUIT

[75] Inventors: Hiroyuki Motegi, Kawasaki; Kenji Matsuo, Yokohama; Akira Nagae, Yokohama; Hideaki Uchida, Yokohama, all of Japan

[73] Assignee: Kabushiki Kaisha Toshiba, Kawasaki, Japan

[21] Appl. No.: 466,472

[22] Filed: Jan. 17, 1990

[30] Foreign Application Priority Data

Jan. 17, 1989 [JP] Japan .................................. 1-8019
Dec. 22, 1989 [JP] Japan ................................ 1-331131

[51] Int. Cl.⁵ ...................... H03K 5/13; H03K 5/159; H03K 3/01
[52] U.S. Cl. ................. 307/603; 307/296.2; 307/606; 307/585; 328/55
[58] Field of Search ................ 307/296.2, 603, 552, 307/553, 573, 571, 576, 448, 451, 585, 580, 481, 582, 594, 595, 597, 605, 606; 328/55

[56] References Cited

U.S. PATENT DOCUMENTS

| | | | |
|---|---|---|---|
| 3,202,769 | 8/1965 | Coleman | 328/55 |
| 3,206,686 | 9/1965 | Goor | 328/55 |
| 4,401,897 | 8/1983 | Martino et al. | 307/296.2 |
| 4,577,124 | 3/1986 | Koike | 307/585 |
| 4,703,200 | 10/1987 | Zangara | 307/576 |
| 4,792,705 | 12/1988 | Ouyane et al. | 307/296.2 |
| 4,797,580 | 1/1989 | Sunter | 307/451 |
| 4,843,256 | 6/1989 | Scade et al. | 307/246 |
| 4,843,258 | 6/1989 | Miyawaki et al. | 307/296.2 |
| 4,876,462 | 10/1989 | Kobatane et al. | 307/582 |
| 4,893,034 | 1/1990 | Tamaru | 307/451 |

FOREIGN PATENT DOCUMENTS

| | | |
|---|---|---|
| 0171022 | 2/1986 | European Pat. Off. . |
| 2604836 | 10/1987 | France . |
| 0242721 | 12/1985 | Japan .................... 307/576 |
| 0105612 | 4/1989 | Japan .................... 307/576 |

OTHER PUBLICATIONS

International Journal of Electronics, vol. 61, No. 3, Sep. 1986, pp. 365-369, London, GB; R. S. Fyath; "Rectangular Pulse-Frequency Multiplier Using Phase-Locked Loop".
Patent Abstracts of Japan, vol. 7, No. 218 (E-200)[1363], Sep. 28, 1983; & JP-A-58 111 429 (Nippon Denki K.K.) 02-07-1983.
Patent Abstracts of Japan, vol. 9, No. 251 (E-348)[1974], Oct. 8, 1985; & JP-A-60 102 017 (Fujitsu K.K.) 06/06/85.
Patent Abstracts of Japan, vol. 10, No. 285 (E-441)[2341], Sep. 27, 1986; & JP-A-61 103 312 (Hitachi LTD) 05/21/86.
IEEE Journal of Solid-State Circuits, vol. SC-22, No. 2, Apr. 1987.

*Primary Examiner*—Stanley D. Miller
*Assistant Examiner*—Toan Tran
*Attorney, Agent, or Firm*—Oblon, Spivak, McClelland, Maier & Neustadt

[57] ABSTRACT

A delay circuit delays an input signal having a predetermined frequency by a time corresponding to a control signal. A delay amount detector detects a signal delay amount of the delay circuit. A charge pump circuit generates a DC voltage corresponding to a pulse width ratio between the input signal and a detection signal of the delay amount detector. This DC voltage is fed back to the delay circuit as a control signal.

64 Claims, 15 Drawing Sheets

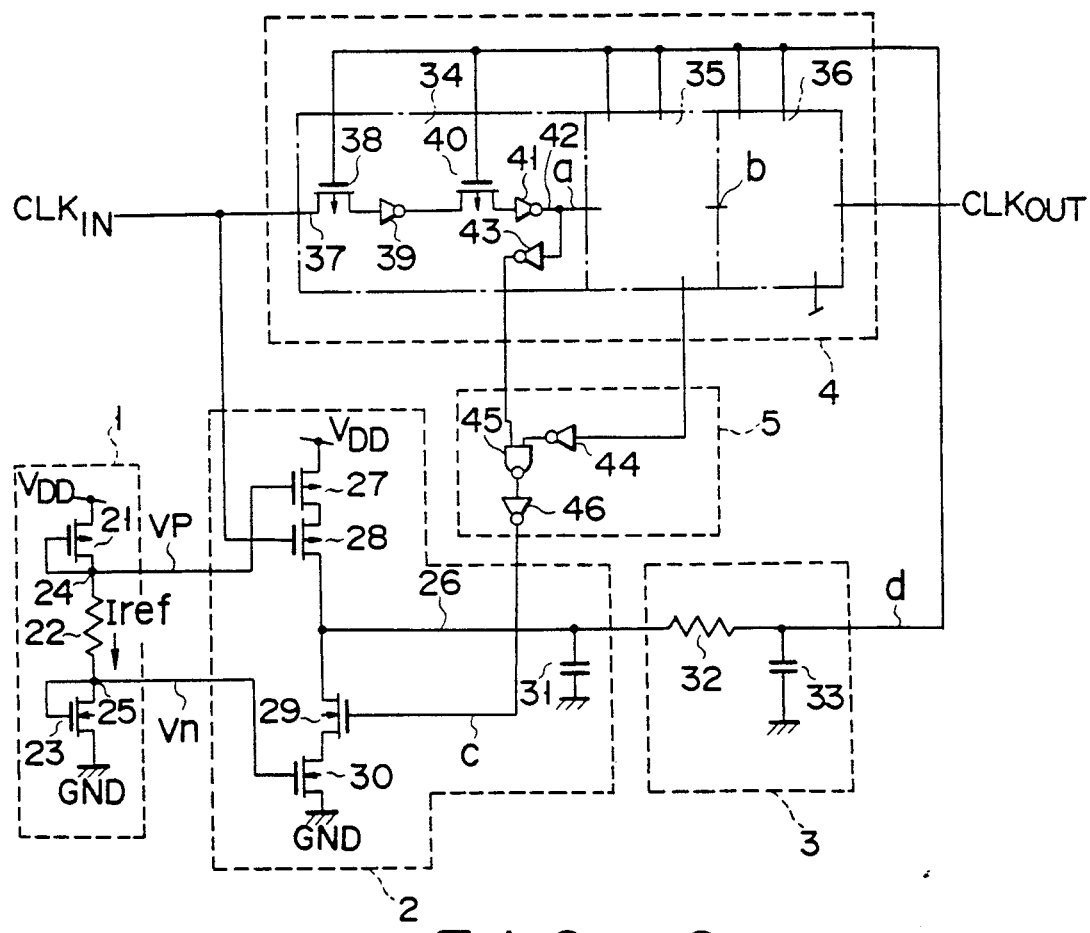
F I G. 2
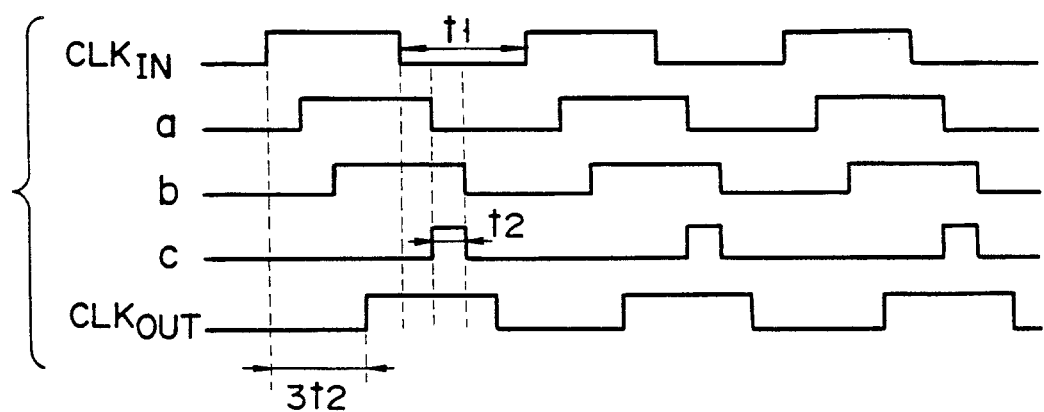
F I G. 3

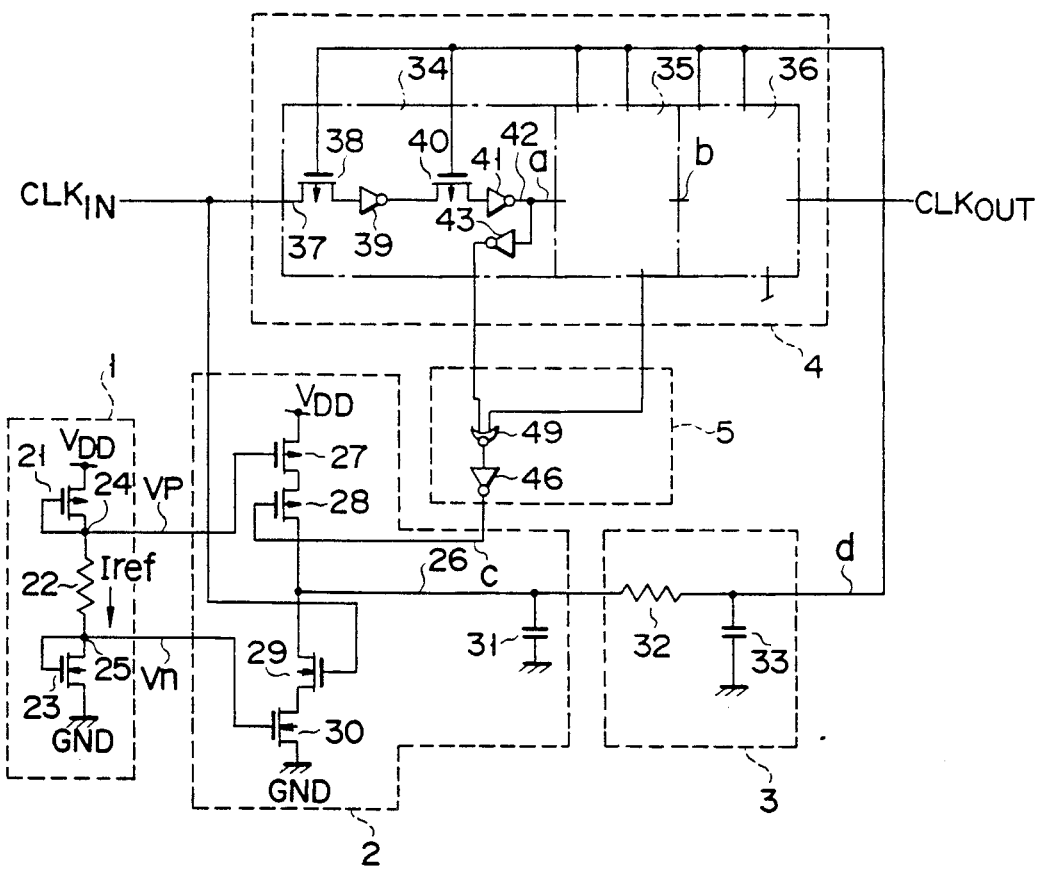
F I G. 4
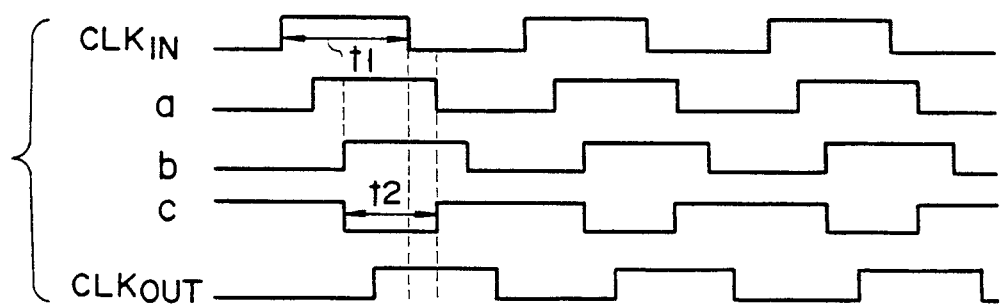
F I G. 5

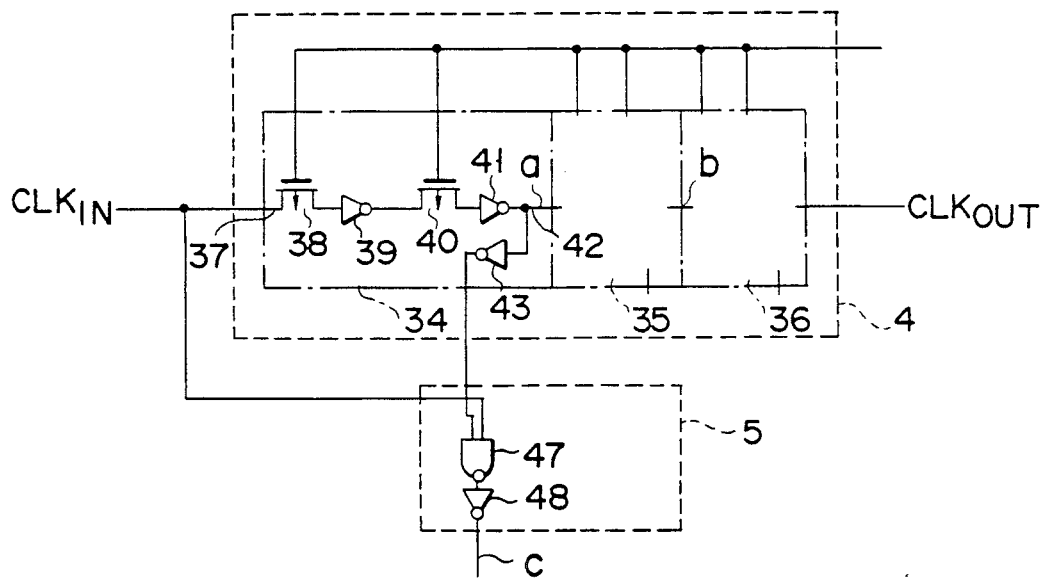
F I G. 7
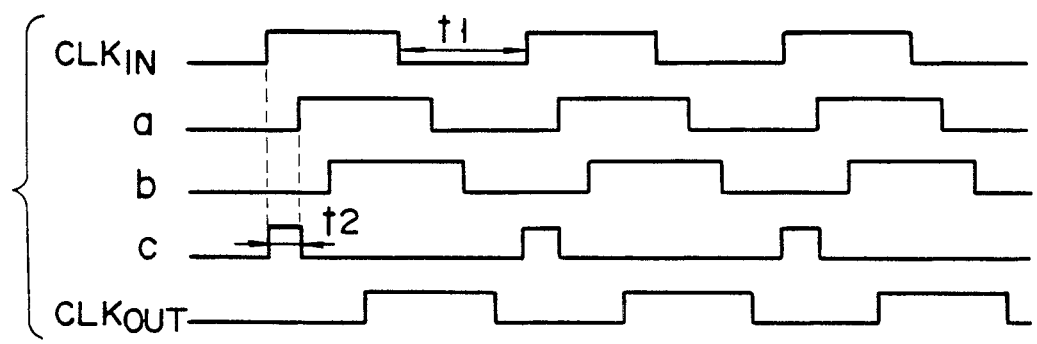
F I G. 8

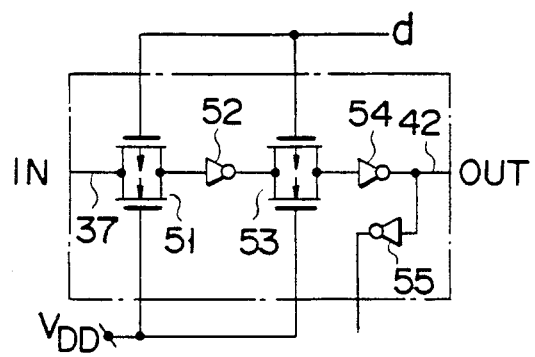
F I G. 9A
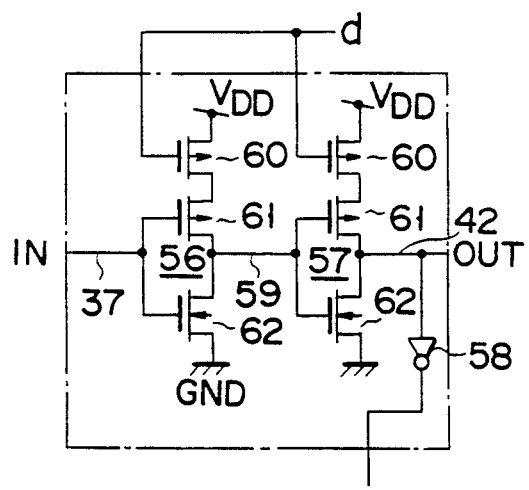
F I G. 9B
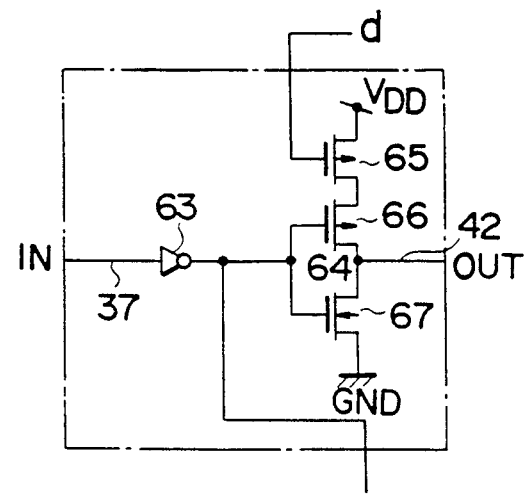
F I G. 9C

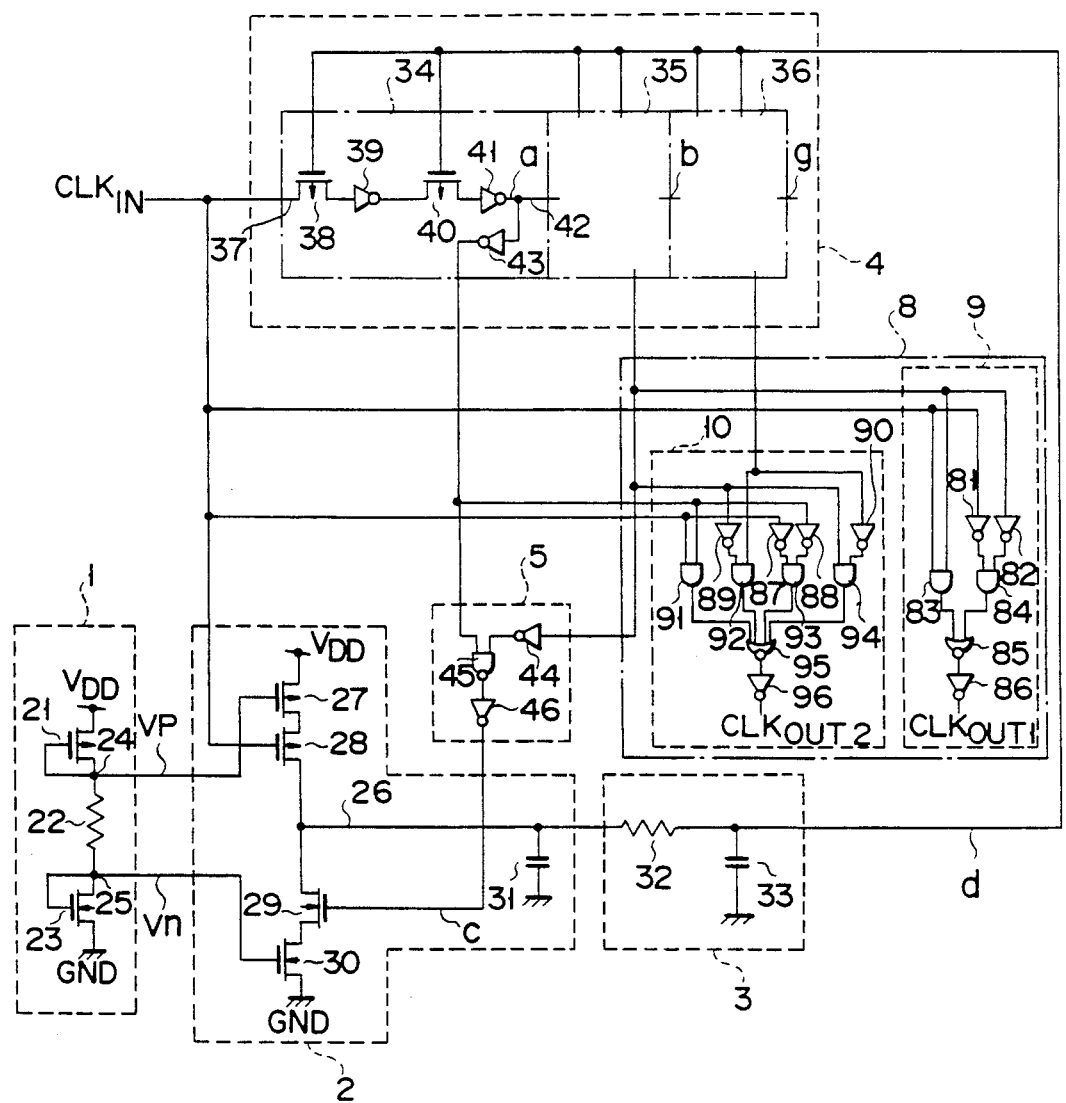
F I G. 11

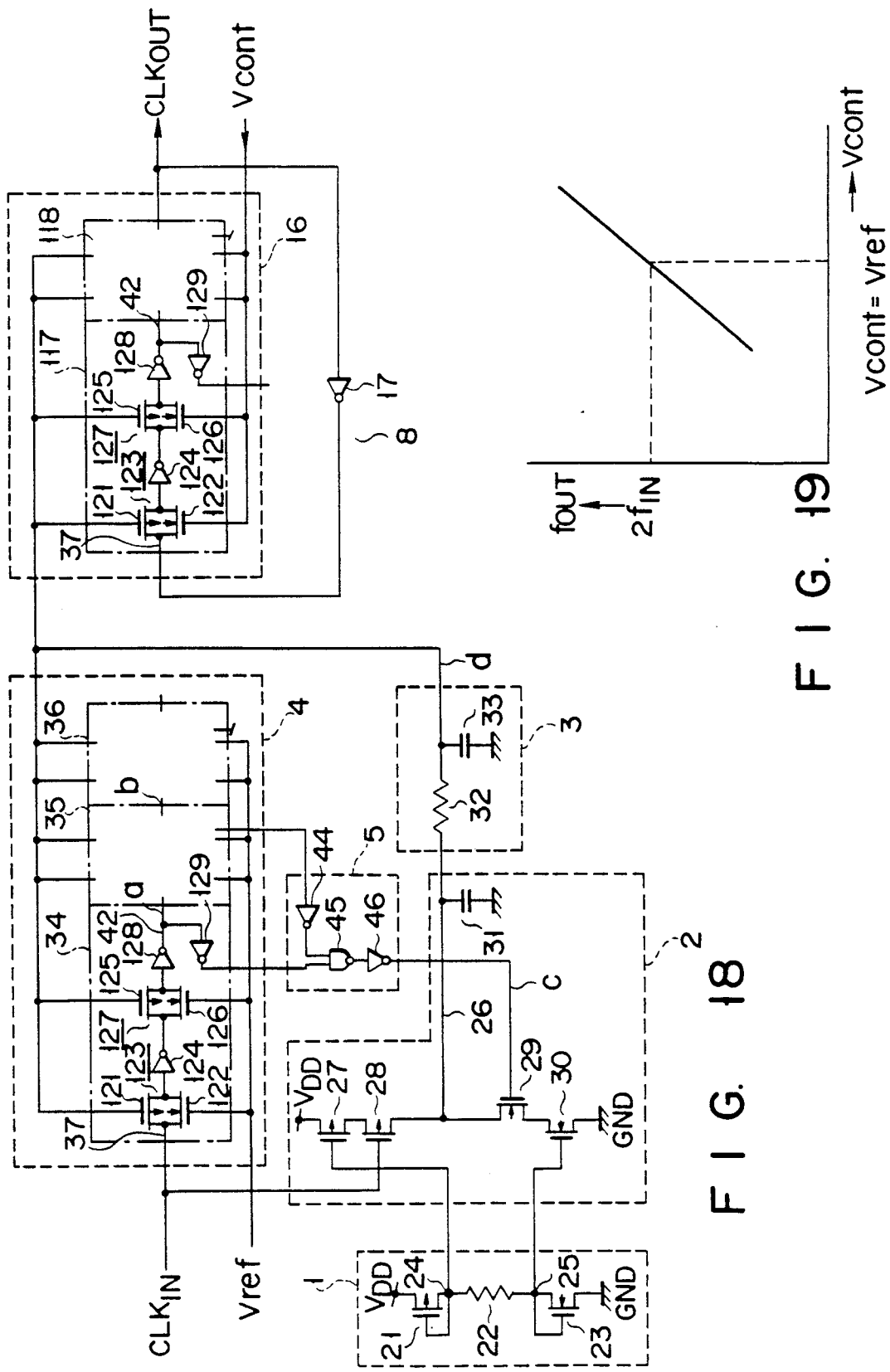
F I G. 18
F I G. 19

SIGNAL DELAY CIRCUIT USING CHARGE PUMP CIRCUIT

BACKGROUND OF THE INVENTION

1. Field of the Invention

The present invention relates to a signal delay circuit, constituted by using a charge pump circuit, for delaying an input signal by a predetermined period and outputting the signal.

2. Description of the Related Art

A signal delay circuit for delaying an input clock signal by a predetermined period, a frequency multiplier for outputting a clock signal having a frequency twice that of an input clock signal, and a voltage-controlled oscillator (to be referred to as a VCO hereinafter) for outputting a clock signal having a frequency corresponding to a control voltage are formed in a semiconductor integrated circuit as needed.

A conventional signal delay circuit is constituted by using elements such as resistors or capacitors. The values of these resistors or capacitors change in accordance with variations in process parameters in the manufacture. Therefore, in the conventional signal delay circuit, a signal delay amount is not uniformly determined. In addition, a conventional frequency multiplier utilizes a signal delay amount produced by a circuit using an inverter and a capacitor. This signal delay amount changes in accordance with the characteristics of the inverter or the value of the capacitor. The characteristics of the inverter also depend on a power source voltage or an ambient temperature. Therefore, since the delay amount is not uniformly determined, lengths of "H"- and "L"-level periods vary. In the worst case, a so-called glitch having almost no "H"- or "L"-level period is generated, or only the "H" or "L" level sometimes continues. In a conventional VCO, a gate length, a threshold voltage, a gate oxide film thickness, and the like of each transistor constituting the VCO vary as process parameters vary in the manufacture. Therefore, an oscillation center frequency largely varies.

SUMMARY OF THE INVENTION

The present invention has been made in consideration of the above situation, and has as its object to provide a signal delay circuit which is not adversely affected by variations in process parameters in the manufacture and can provide a predetermined delay amount.

It is another object of the present invention to provide a clock signal generator having a stable output frequency.

It is still another object of the present invention to provide a clock signal generator capable of always fixing an oscillation center frequency to a predetermined value without varying it.

In order to achieve the above objects of the present invention, there is provided a signal delay circuit comprising: delaying means for delaying an input signal having a predetermined frequency by a time corresponding to a control signal; delay amount detecting means for detecting a signal delay amount corresponding to the input signal in the delaying means; a charge pump circuit for receiving the input signal and a detection signal from the delay amount detecting means, and generating a DC voltage corresponding to a pulse width ratio between the two signals; and feedback means for feeding back the output voltage from the charge pump circuit to the delaying means as a control signal.

BRIEF DESCRIPTION OF THE DRAWINGS

FIG. 2 is a circuit diagram showing an arrangement of a signal delay circuit according to the first embodiment of the present invention;

FIG. 3 is a timing chart of the circuit shown in FIG. 2;

FIG. 4 is a circuit diagram showing an arrangement of a modification of the circuit according to the first embodiment;

FIG. 5 is a timing chart of the circuit shown in FIG. 4;

FIG. 7 is a circuit diagram showing an arrangement of a part of a circuit of still another modification of the circuit according to the first embodiment;

FIG. 8 is a timing chart of the circuit shown in FIG. 7;

FIGS. 9A, 9B, and 9C are circuit diagrams showing arrangements of parts of circuits according to a modification of the circuit of the first embodiment;

FIG. 11 is a circuit diagram showing an arrangement of a clock signal generator according to the second embodiment of the present invention;

FIG. 18 is a circuit diagram showing an arrangement of a clock signal generator according to the sixth embodiment of the present invention; and FIG. 19 is a graph showing the characteristics of the circuit shown in FIG. 18.

DETAILED DESCRIPTION OF THE PREFERRED EMBODIMENTS

Embodiments of the present invention will be described below with reference to the accompanying drawings.

Figure 1:
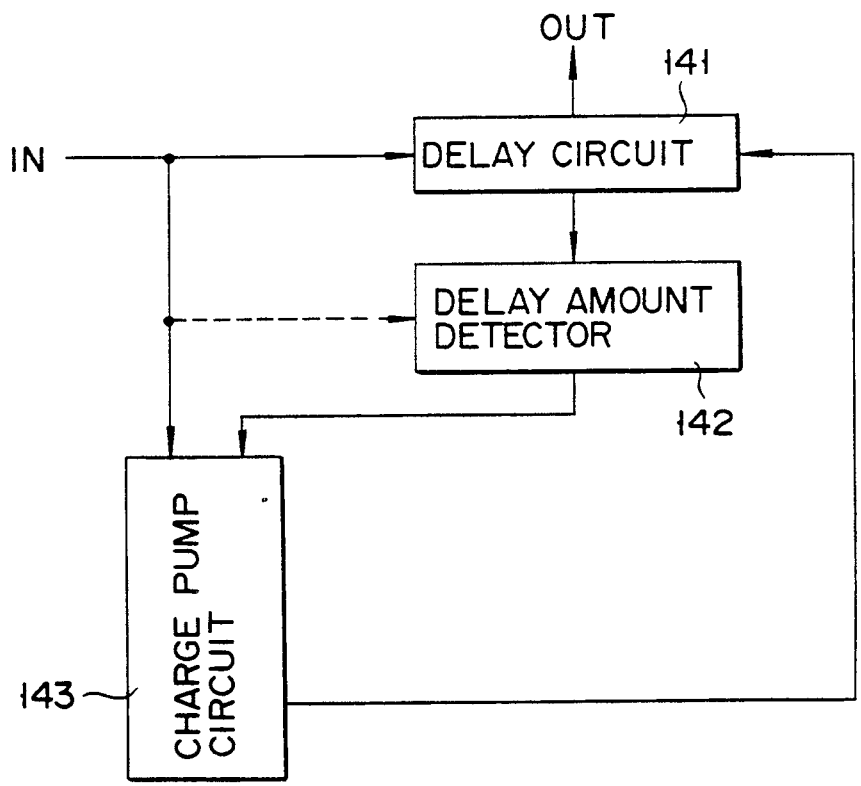
FIG. 1 is a block diagram for explaining the principle of the present invention.

FIG. 1 is a block diagram for explaining the principle of a signal delay circuit according to the present invention. Referring to FIG. 1, reference symbol IN denotes a clock signal having a predetermined frequency. The signal IN is supplied to a delay circuit 141. The circuit 141 delays the signal IN, and its delay time is set in accordance with a control signal to be described later. A delayed output signal from the delay circuit 141 is supplied to a delay amount detector 142. The detector 142 detects the delay time with respect to the clock signal IN. The signal IN is sometimes supplied to the detector 142 as indicated by a broken line in FIG. 1 as needed. A detection signal from the detector 142 and the signal IN are supplied to a charge pump circuit 143. The circuit 143 charges a predetermined capacitor for only a pulse period of the signal IN and discharges the predetermined capacitor for only a pulse period of the detection signal so that a charge amount and a discharge amount of the above capacitor equal to each other. In addition, the circuit 143 generates a control voltage such that the delay time of the delay circuit 141 is arbitrarily set in accordance with a current power ratio between current power upon charge and current power upon discharge. The generated control voltage is fed back to the delay circuit 141 as a control signal. The output from the charge pump circuit 143 is sometimes supplied to the delay circuit 141 via a low-pass filter circuit as needed.

Various types of embodiment of the present invention will be described in detail below.

FIG. 2 is a circuit diagram showing an arrangement of a signal delay circuit according to the present invention. This embodiment comprises a reference current set circuit 1 and a charge pump circuit 2, both of which correspond to the charge pump circuit 143 shown in FIG. 1, a low-pass filter circuit 3, a delay circuit 4 corresponding to the delay circuit 141 shown in FIG. 1, and a logic circuit 5 corresponding to the delay amount detector 142 shown in FIG. 1.

The reference current set circuit 1 sets reference current values of inflow and outflow currents with respect to a capacitor to be described later in the charge pump circuit 2, and comprises a p-channel MOS transistor 21, a resistor 22, and an n-channel MOS transistor 23 inserted in series between an application point of a power source voltage $V_{DD}$ and an application point of a ground voltage GND. The gate of the transistor 21 is connected to its drain, i.e., a node 24 at one terminal of the resistor 22. The gate of the transistor 23 is connected to its drain, i.e., a node 25 at the other terminal of the resistor 22. In this circuit, a current $I_{ref}$ flows through the transistor 21, the resistor 22, and the transistor 23. In order to lower this current value and to lower charge amounts due to charge and discharge currents in the charge pump circuit 2, the value of the resistor 22 is normally set much higher than ON resistances of the transistors 21 and 23 so that the value of $I_{ref}$ is determined by the value of the resistor 22. In this circuit, if the element size is the same as the transistor 21, a voltage $V_p$ which allows a current equal to the current $I_{ref}$ to flow through the p-channel MOS transistor is obtained at the node 24. If the element size is the same as the transistor 23, a voltage $V_n$ which allows a current equal to the current $I_{ref}$ to flow through the n-channel MOS transistor is applied to the node 25. The voltages $V_p$ and $V_n$ are applied to the charge pump circuit 2.

The circuit 2 comprises two p-channel MOS transistors 27 and 28 inserted in series between the application point of the power source voltage $V_{DD}$ and an output node 26, two n-channel MOS transistors 29 and 30 inserted in series between the node 26 and the application point of the ground voltage GND, and a capacitor 31 consisting of, e.g., drain capacitances of the transistors 28 and 29 present at the output node and a wiring capacitance. Note that the above capacitor 31 is not parasitically present but may be a real capacitor. The gates of the transistors 27 and 30 receive the voltages $V_p$ and $V_n$, respectively, output from the reference current set circuit 1. An input clock signal $CLK_{IN}$ having a predetermined frequency is supplied to the gate of the transistor 28. An output signal c from the logic circuit 5 is supplied to the gate of the transistor 29.

The transistor 27 constitutes a current mirror circuit together with the transistor 21 in the circuit 1. A current flowing through the transistor 27 is determined on the basis of the value of the reference current $I_{ref}$ and a size ratio between the transistors 21 and 27. For example, assuming that a W/L (ratio of a channel width to a channel length: current power of a transistor is determined by this value) of the transistor 21 is 1, a W/L of the transistor 27 is set to be $A_1$ (which is a positive value and a arbitrary value). Similarly, the transistor 30 constitutes a current mirror circuit together with the transistor 23 in the circuit 1. A current flowing through the transistor 30 is determined on the basis of the value of the reference current $I_{ref}$ and a size ratio between the transistors 23 and 30. For example, assuming that a W/L of the transistor 23 is 1, a W/L of the transistor 30 is set to be $A_2$ (which is a positive value and a arbitrary value).

In the circuit having the above arrangement, the transistors 27 and 28 flow a current to the capacitor 31. While the transistor 28 is kept on on the basis of the input clock signal $CLK_{IN}$, the capacitor 31 is charged by a current having a predetermined value determined by the transistor 27. The two n-channel MOS transistors 29 and 30 cause a current to flow out from the capacitor 31. While the transistor 29 is kept on on the basis of the output signal from the logic circuit 5, the capacitor 31 is discharged by a current having a predetermined value determined by the transistor 30.

The low-pass filter circuit 3 obtains a DC voltage by smoothing a terminal voltage of the capacitor 31 of the charge pump circuit 2, and comprises a resistor 32 and a capacitor 33. If the value of the capacitor 31 is sufficiently large, the capacitor 33 or the resistor 32 of the low-pass filter circuit 3 or the circuit 3 itself is not sometimes required. A signal d obtained by the circuit 3 is supplied to the delay circuit 4.

The delay circuit 4 is constituted by cascade-connecting, e.g., three delay stages 34, 35, and 36 having the same arrangement. The input clock signal $CLK_{IN}$ is supplied to the first delay stage 34. Output signals a and b from the delay stages 34 and 35 are sequentially supplied to the subsequent stages as input signals. An output signal from the last delay stage 36 is supplied as a delay clock signal $CLK_{OUT}$. Each of the delay stages 34, 35, and 36 comprises a p-channel MOS transistor 38 connected at its one terminal to an input node 37, an inverter 39 having an input terminal connected to the other terminal of the transistor 38, a p-channel MOS transistor 40 having one terminal connected to the output terminal of the inverter 39, an inverter 41 having an input terminal connected to the other terminal of the transistor 40, an output node 42 connected to the output terminal of the inverter 41, and an inverter 43 having an input terminal connected to the output node 42. The output signal d from the low-pass filter circuit 3 is supplied in parallel to the gates of the transistors 38 and 40 of each of the delay stages 34, 35, and 36.

The logic circuit 5 is for obtaining the signal c and comprises an inverter 44 for inverting an output signal from the inverter 43 of the delay stage 35, a NAND gate 45 for receiving an output signal from the inverter 44 and the output signal from the inverter 43 of the delay stage 34, and an inverter 46 for inverting an output signal from the NAND gate 45.

An operation of the circuit having the above arrangement will be described below with reference to a timing chart shown in FIG. 3. Assume that the transistor 28 of the charge pump circuit 2 is to be turned on. In this case, the input clock signal $CLK_{IN}$ is in an "L"-level period. Assuming that this "L"-level period is $t_1$, a charge amount $Q_H$ charged in the capacitor 31 within the period $t_1$ is given by the following equation:

$$QH = I_{ref} \cdot A_1 \cdot t_1 \tag{1}$$

Assume that the transistor 29 of the charge pump circuit 2 is to be turned on. In this case, the output signal c from the logic circuit 5 is in an "H"-level period. Assuming that this "H"-level period is $t_2$, a discharge amount $Q_L$ discharged from the capacitor 31 within the period $t_2$ is given by the following equation:

$$Q_L = I_{ref} \cdot A_2 \cdot t_2 \tag{2}$$

If a ratio $t_1/t_2$ coincides with a ratio $A_2/A_1$, QH, is given by the following equation:

$$\begin{aligned} QH &= I_{ref} \cdot A_1 \cdot t_1 \\ &= I_{ref} \cdot A_1 \cdot \{(A_2/A_1) \cdot t_2\} \\ &= I_{ref} \cdot A_2 \cdot t_2 = Q_L \end{aligned} \tag{3}$$

If $t_1/t_2 = A_2/A_1$ as described above, i.e., if a current power ratio between the transistors 27 and 30 coincides with a reciprocal of a pulse width ratio between the input clock signal $CLK_{IN}$ and the output signal c from the logic circuit 5, a charge amount flowing in the capacitor 31 is equal to that flowing out from the capacitor 31, and a voltage value of the output signal d from the low-pass filter circuit 3 is determined to be a certain arbitrary value. At this time, in each delay stage of the delay circuit 4 which receives a predetermined voltage, ON resistances of the transistors 38 and 40 become predetermined values, and a delay amount in each delay stage becomes a predetermined value.

Assuming that the value of $A_1$ of the transistor 27 is set to be 2, the value of $A_2$ of the transistor 30 is set to be 8, and the value of $A_2/A_1$ is set to be 4 in the charge pump circuit 2, an operation of the circuit of this embodiment becomes stable when $t_1/t_2 = 4$, i.e., $t_1 = 4t_2$.

Assuming that $t_1 > 4t_2$ is obtained, a difference $Q_D$ between the charge amounts to be charged to and discharged from the capacitor 31 of the charge pump circuit 2 is given by the following equation:

$$\begin{aligned} QD &= I_{ref} \cdot A_1 \cdot t_1 - I_{ref} \cdot A_2 \cdot t_2 \\ &= I_{ref} \cdot A_1 \cdot t_1 - 4 I_{ref} \cdot A_1 \cdot t_2 \\ &= I_{ref} \cdot A_1 (t_1 - 4t_2) \end{aligned} \tag{4}$$

Since $t_1 > 4t_2$, $Q_D$ of the equation (4) is obtained as $Q_D > 0$. That is, in this case, the charge amount is larger than the discharge amount with respect to the capacitor 31, and a voltage value of the output signal d of the low-pass filter circuit 3 rises. As a result, ON resistances of the transistors 38 and 40 in each delay stage of the delay circuit 4 rise to increase the delay amount in each delay stage. That is, $t_2$ as a delay time difference between the signals a and b shown in FIG. 2 is increased. This state continues from a state of $t_1 > 4t_2$ to a state of $t_1 = 4t_2$. When the state of $t_1 = 4t_2$ is obtained, the charge and discharge amounts with respect to the capacitor 31 become equal to each other, and the rise in voltage of the signal d is stopped and stabilized.

To the contrary, assuming that $t_1 < 4t_2$ is obtained, the charge amount difference $Q_D$ given the above equation (4) is obtained as $Q_D < 0$, the discharge amount becomes larger than the charge amount with respect to the capacitor 31. Therefore, the voltage of the output signal d from the low-pass filter circuit 3 drops to reduce the ON resistances of the transistors 38 and 40 in each delay stage of the delay circuit 4. Therefore, the delay amount in each delay stage falls to reduce $t_2$ as a delay time difference between the signals a and b. This state continues from a state of $t_1 < 4t_2$ to a state of $t_1 = 4t_2$. When the state of $t_1 = 4t_2$ is obtained, the charge and discharge amounts with respect to the capacitor 31 become equal to each other, and the voltage drop of the signal d is stopped and stabilized.

In this manner, the delay amount $t_2$ in each delay stage of the delay circuit 4 is always controlled to be a predetermined value on the basis of the ratio of $A_2$ to $A_1$ by a phase synchronizing loop constituted by the charge pump circuit 2, the low-pass filter circuit 3, the delay circuit 4, and the logic circuit 5. That is, in this embodiment, the delay amount corresponding to $\frac{1}{4}$ of the "L"-level period $t_1$ of the input clock signal $CLK_{IN}$ can be obtained in each delay stage, and the delay time of the output clock signal $CLK_{OUT}$ with respect to the input clock signal $CLK_{IN}$ is obtained as $3t_2$.

In this embodiment, the ratio of $A_2$ to $A_1$ ($A_2/A_1$) is set to be 4, and the three delay stages are provided in the delay circuit 4, thereby obtaining the delay time of $3t_2$. Various delay times, however, can be obtained by increasing/decreasing the value of $A_2/A_1$ and the number of delay stages in the delay circuit 4.

Various modifications of the circuit according to the above embodiment will be described below.

FIG. 4 is a circuit diagram showing an arrangement according to the first modification of the circuit shown in FIG. 2. In the circuit shown in FIG. 2, the logic circuit 5 is constituted by the inverter 44, the NAND gate 45, and the inverter 46, the output signal c from the circuit 5 is supplied to the gate of the n-channel MOS transistor 29, and the input clock signal $CLK_{IN}$ is supplied to the gate of the p-channel MOS transistor 28. In this modification, however, a logic circuit 5 is constituted by a NOR gate 49 for receiving output signals from inverters 43 in delay stages 34 and 35 and an inverter 46 for inverting an output signal from the NOR gate 49, an output signal c from the circuit 5 is supplied to the gate of a p-channel MOS transistor 28, and an input clock signal $CLK_{IN}$ is supplied to the gate of an n-channel MOS transistor 29.

In this case, the output signal c from the circuit 5 has a relationship as shown in a timing chart of FIG. 5. If a ratio of $A_2$ in a transistor 30 to $A_1$ of a transistor 27 is set to coincide with a reciprocal of a pulse width ratio between the input clock signal $CLK_{IN}$ and the output signal c from the circuit 5, a delay time similar to that shown in FIG. 2 is obtained.

Figure 6:
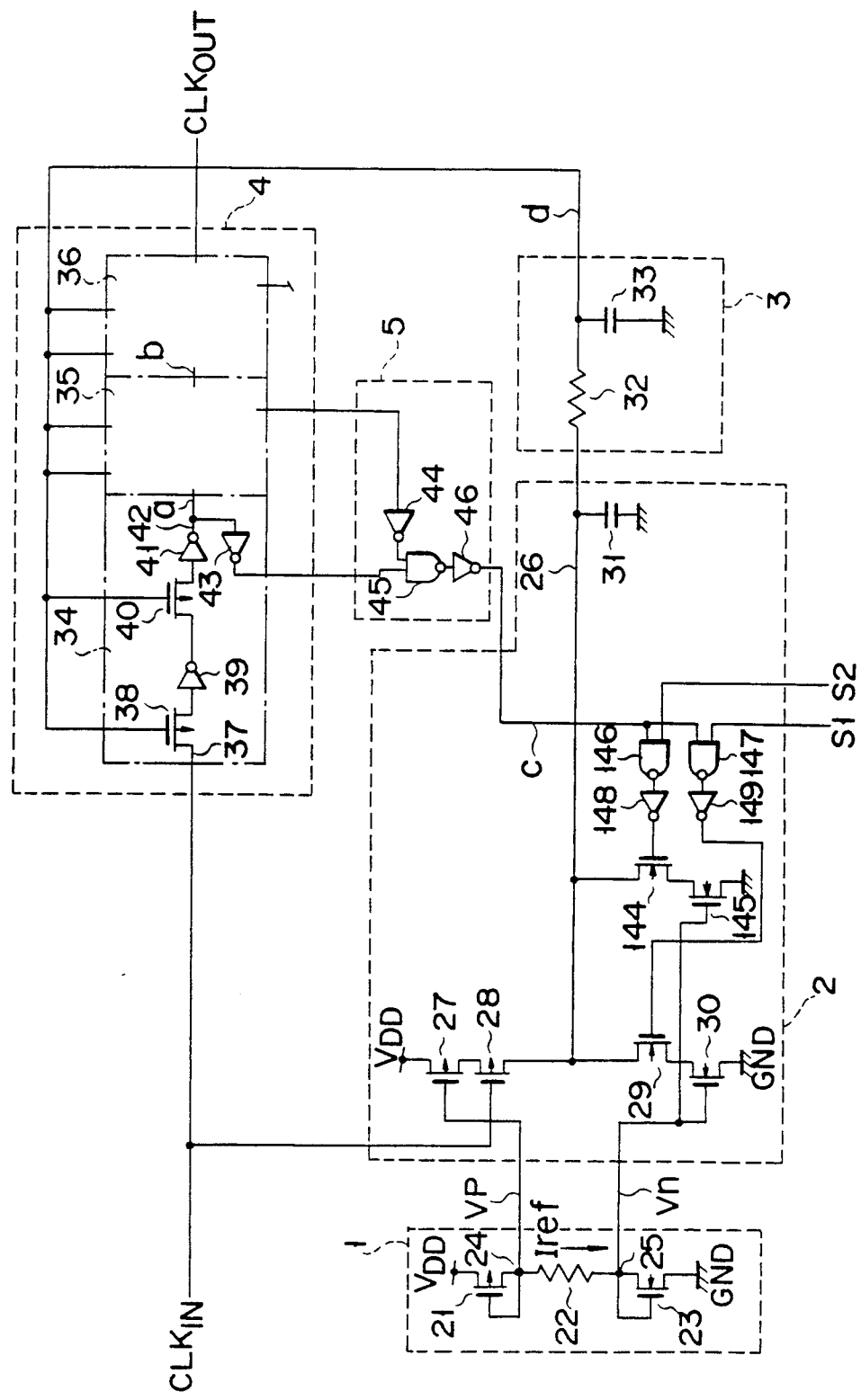
FIG. 6 is a circuit diagram showing an arrangement of another modification of the circuit according to the first embodiment.

FIG. 6 is a circuit diagram showing an arrangement according to the second modification of the embodiment shown in FIG. 2.

This modification comprises, in the charge pump circuit 2, two n-channel MOS transistors 29 and 30 inserted in series between an output node 26 and an application point of a ground voltage GND, two n-channel MOS transistors 144 and 145 inserted in series between an output node 26 and an application point of the ground voltage GND, two NAND gates 146 and 147, and two inverters 148 and 149. An output signal c from the logic circuit 5 is supplied in parallel to input terminals of the NAND gates 146 and 147, and select signals S2 and S1 are externally supplied to the other input terminals of the NAND gates 146 and 147. Output signals from the NAND gates 146 and 147 are supplied to the gates of the transistors 144 and 29 via the inverters 148 and 149, respectively. The voltage $V_n$ is supplied in parallel to the gates of the transistors 30 and 145.

In the circuit having the above arrangement, if the select signal S1 is switched to an "H" level, the transistor 29 is selected, and a delay time similar to that of the embodiment shown in FIG. 2 is obtained. If the select signal S2 is switched to the "H" level, the transistor 144 is selected to discharge the capacitor 31 in accordance with the current power of the transistor 145. For example, if the current power of the transistor 145 is set twice that of the transistor 30, the pulse width of the signal c shown in FIG. 3 is reduced to be $\frac{1}{2}$. Therefore, a delay time in each delay stage of a delay circuit 4 becomes $(\frac{1}{2})t_2$, and a total delay time, i.e., a delay time of an output clock signal $CLK_{OUT}$ with respect to an input clock signal $CLK_{IN}$ becomes $(3/2)t_2$. That is, in this modification, a discharge current value of the charge pump circuit 2 can be controlled by the external control signals (S1 and S2). Note that such a modification can be similarly applied to the charge current side.

The same operation can be obtained by using an arrangement as shown in a circuit diagram of FIG. 7 instead of the logic circuit 5. That is, a logic circuit of this modification comprises a NAND gate 47 for receiving an output signal from an inverter 43 in the delay stage 34 and the input clock signal $CLK_{IN}$ and an inverter 48 for inverting an output signal from the NAND gate 47. As shown in a timing chart of FIG. 8, an output signal c from the logic circuit having the above arrangement has a pulse width $t_2$ similar to that shown in FIG. 2.

FIGS. 9A, 9B, and 9C are circuit diagrams each showing another arrangement of the delay stage provided in the delay circuit 4.

An arrangement shown in FIG. 9A comprises a CMOS transmission gate 51 having parallel p- and n-channel MOS transistors and one terminal connected to an input node 37, an inverter 52 having an input terminal connected to the other terminal of the transmission gate 51, a CMOS transmission gate 53 having parallel p- and n-channel MOS transistors and one terminal connected to the output terminal of the inverter 52, an inverter 54 having an input terminal connected to the other terminal of the transmission gate 53 and an output terminal connected to an output node 42, and an inverter 55 having an input terminal connected to the output node 42. An output signal d from the low-pass filter circuit 3 is supplied in parallel to the gates of the p-channel MOS transistor sides of the transmission gates 51 and 53, and a power source voltage $V_{DD}$ is supplied in parallel to the gates of the n-channel MOS transistor sides. That is, since the n-channel MOS transistors applied with the power source voltage $V_{DD}$ on their gates are connected in parallel to the p-channel MOS transistors 38 and 40 shown in FIG. 2, a change is obtained in the delay transmission characteristics of this delay stage.

A delay stage shown in FIG. 9B comprises two gate circuits 56 and 57 and an inverter 58. The gate circuit 56 is constituted by two p-channel MOS transistors 60 and 61 inserted in series between an application point of a power source voltage $V_{DD}$ and an internal node 59, and an n-channel MOS transistor 62 inserted between the internal node 59 and an application point of a ground voltage GND. An output signal d from the low-pass filter circuit 3 is supplied to the gate of the transistor 60, and a signal from an input node 37 is supplied to the gates of the transistors 61 and 62. Similarly, the other gate circuit 57 is constituted by two p-channel MOS transistors 60 and 61, and an n-channel MOS transistor 62. The signal d is supplied to the gate of the transistor 60, and a signal from the internal node 59 is supplied to the gates of the transistors 61 and 62. The inverter 58 inverts a signal from the output node 42.

In this delay stage, ON resistances of the p-channel MOS transistors 60 in the gate circuits 56 and 57 are controlled in accordance with the output signal d from the low-pass filter circuit 3 to determine a delay amount.

A delay stage shown in FIG. 9C comprises an inverter 63 and a gate circuit 64. A signal from the input node 37 is supplied to the inverter 63. The gate circuit 64 is constituted by two p-channel MOS transistors 65 and 66 inserted in series between an application point of a power source voltage $V_{DD}$ and an output node 42 and an n-channel MOS transistor 67 inserted between the output node 42 and an application point of a ground voltage GND. An output signal d from the low-pass filter circuit 3 is supplied to the gate of the transistor 65, and an output signal from the inverter 63 is supplied to the gates of the transistors 66 and 67. An output signal from the inverter 63 is also used as an input signal to the logic circuit 5.

In the delay stage having the above arrangement, an ON resistance of the p-channel MOS transistor 65 in the gate circuit 64 is controlled in accordance with the output signal d from the low-pass filter circuit 3 to determine a delay amount.

Figure 10:
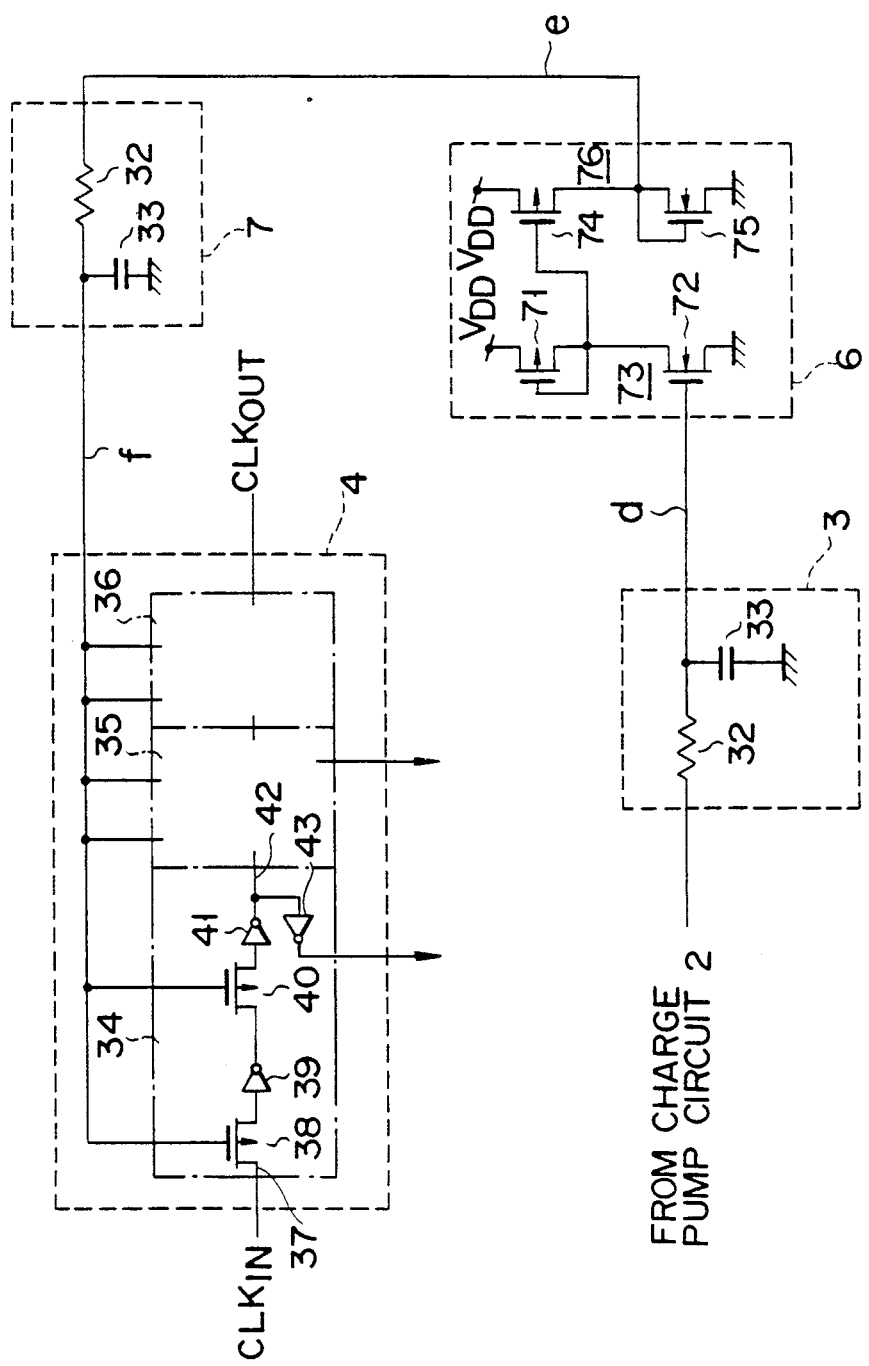
FIG. 10 is a circuit diagram showing an arrangement of a part of a circuit according to a modification of the circuit of the first embodiment.

In the circuit according to the embodiment shown in FIG. 2, the output signal d from the low-pass filter 3 is directly supplied to the delay circuit 4. As shown in a circuit arrangement according to still another modification shown in FIG. 10, however, a signal d from a low-pass filter circuit 3 may be supplied to a level converter 6 and an output signal e from the converter 6 may be supplied to a delay circuit 4 via a low-pass filter 7. Also in this case, the low-pass filter circuit 7 is provided as needed.

The level converter 6 is constituted by an inverter 73 which includes a p-channel MOS transistor 71 and an n-channel MOS transistor 72 and receives the signal d, and a source follower type inverter 76 which includes a p-channel MOS transistor 74 and an n-channel MOS transistor 75 and receives an output signal from the inverter 73. Similar to the low-pass filter circuit 3, the low-pass filter circuit 7 is constituted by a resistor 32 and a capacitor 33.

The output signal d from the low-pass filter circuit 3 changes within a voltage range from $V_{DD}$ to GND. The output signal e from the level converter 6, however, changes between $V_{DD}$ and GND+Vthn (Vthn is a threshold voltage of the n-channel MOS transistor). That is, a voltage change range of an output signal f from the low-pass filter circuit 7 is narrowed by a decrease in voltage range of the signal e with respect to that of the signal d, and the sensitivities of transistors 38 and 40 in each delay stage of a delay circuit 4 are reduced. That is, a condition of $\Delta Vd > \Delta Vf$ is satisfied between a small voltage change $\Delta Vf$ of the signal f and a small voltage change $\Delta Vd$ of the signal d. As a result, the sensitivity of each delay stage is reduced, and redundancy is obtained in stability and characteristics of the entire circuit system in correspondence with the sensitivity reduction.

The second embodiment of the present invention will be described below. FIG. 11 is a circuit diagram showing an arrangement of a clock signal generator according to the present invention. In the second embodiment, the signal delay circuit which the ratio of $A_2/A_1$ is set to be 4 shown in FIG. 2, is used to extract an output clock signal $CLK_{OUT1}$ having a frequency twice that of an input clock signal $CLK_{IN}$ and an output clock signal $CLK_{OUT2}$ having a frequency four times that of the signal $CLK_{IN}$.

That is, in this embodiment, an output logic circuit 8 is additionally provided in a signal delay circuit comprising a reference current set circuit 1, a charge pump circuit 2, a low-pass filter circuit 3, a delay circuit 4, and a logic circuit 5 as shown in FIG. 2.

Figure 12:
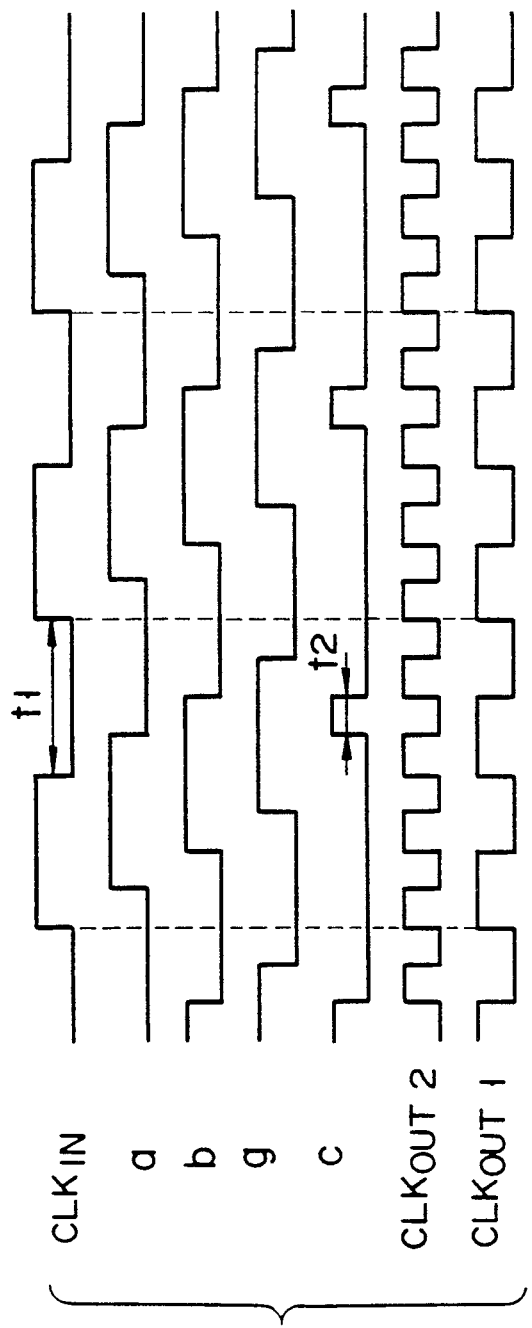
FIG. 12 is a timing chart of the circuit shown in FIG. 11.

The logic circuit 8 is constituted by two logic circuits 9 and 10. The logic circuit 9 includes an inverter 81 for inverting the input clock signal $CLK_{IN}$, an inverter 82 for inverting an output signal from an inverter 43 in a delay stage 35, an AND gate 83 for receiving the signal $CLK_{IN}$ and an output signal from the inverter 43 in the delay stage 35, an AND gate 84 for receiving output signals from the inverters 81 and 82, a NOR gate 85 for receiving output signals from the AND gates 83 and 84, and an inverter 86 for inverting an output signal from the NOR gate 85. As shown in a timing chart of FIG. 12, the logic circuit 9 outputs the clock signal $CLK_{OUT1}$ having a frequency twice that of the signal $CLK_{IN}$.

The other logic circuit 10 includes an inverter 87 for inverting the signal $CLK_{IN}$, inverters 88 to 90 for inverting output signals from inverters 43 in delay stages 34 to 36, respectively, an AND gate 91 for receiving the signal $CLK_{IN}$ and an output signal from the inverter 43 in the delay stage 34, an AND gate 92 for receiving an output signal from the inverter 89 and an output signal from the inverter 43 in the delay stage 36, an AND gate 93 for receiving output signals from the inverters 87 and 88, an AND gate 94 for receiving an output signal from the inverter 43 in the delay stage 35 and an output signal from the inverter 90, a NOR gate 95 for receiving output signals from the AND gates 91 to 94, and an inverter 96 for inverting an output signal from the NOR gate 95. As shown in the timing chart of FIG. 12, the logic circuit 10 outputs the clock signal $CLK_{OUT2}$ having a frequency four times that of the signal $CLK_{IN}$.

In this embodiment, the input clock signal $CLK_{IN}$ a predetermined frequency and delayed outputs normally controlled to have a predetermined delay amount by a phase-locked loop as described above from the delay stages 34 to 36 are selectively supplied to the logic circuits 9 and 10. Therefore, the frequencies of the output clock signals $CLK_{OUT1}$ and $CLK_{OUT2}$ from the logic circuits 9 and 10 are not adversely affected by variations in manufacturing conditions or the like but can be stabilized.

In this embodiment, various types of logic circuit may be provided in the output logic circuit 8 to extract an output clock signal having a frequency of a arbitrary multiple of the frequency of the signal $CLK_{IN}$. Also in this embodiment, a logic circuit 5 having the arrangement as shown in FIG. 4 may be provided to supply the input clock signal $CLK_{IN}$ to the gate of an n-channel MOS transistor 29 and an output signal c from the logic circuit 5 to the gate of a p-channel MOS transistor 28, thereby operating the transistors. All the modifications of the first embodiment shown in FIG. 2 can be applied to this second embodiment.

Figure 13:
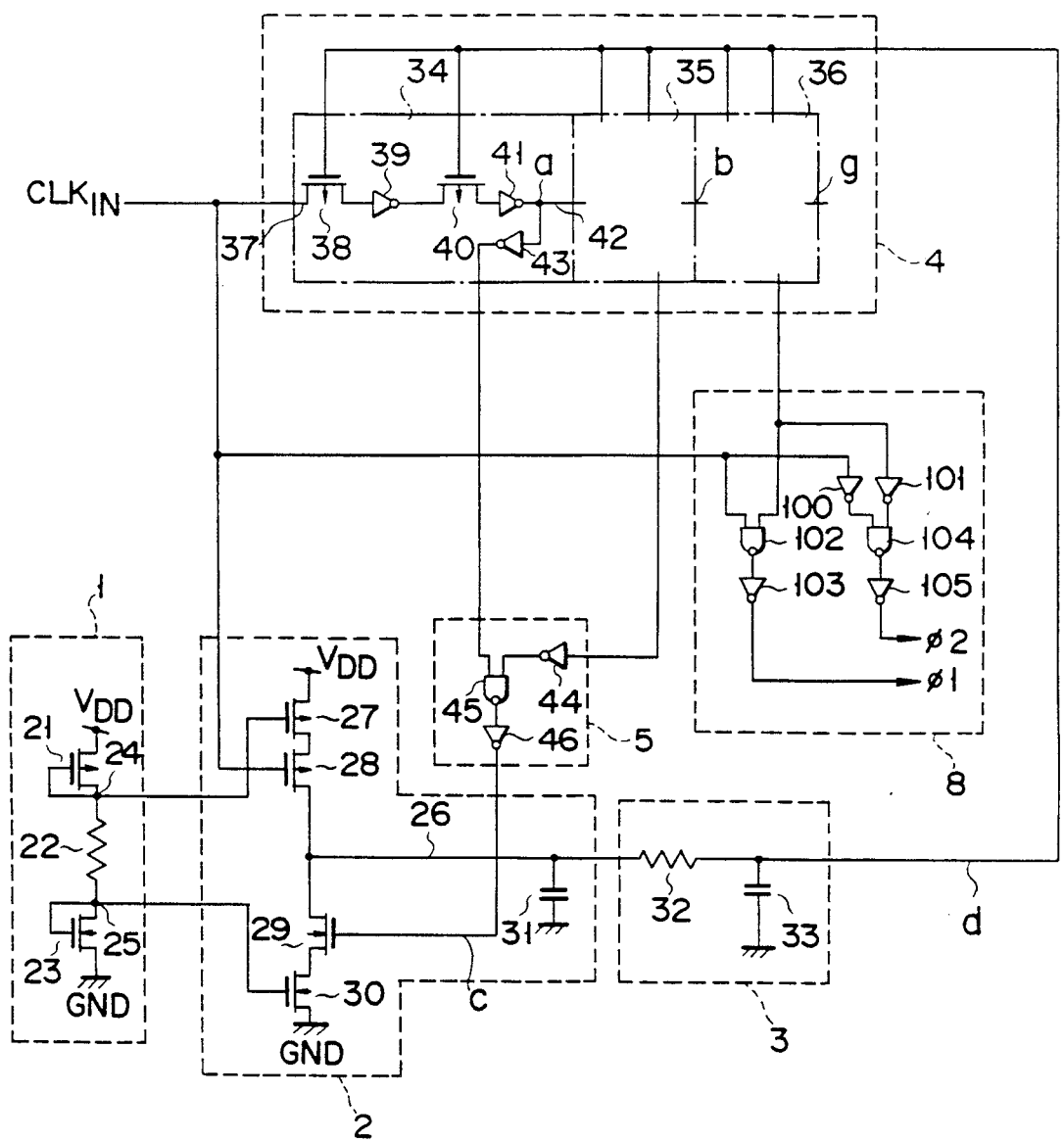
FIG. 13 is a circuit diagram showing an arrangement of a clock signal generator according to the third embodiment of the present invention.
Figure 14:
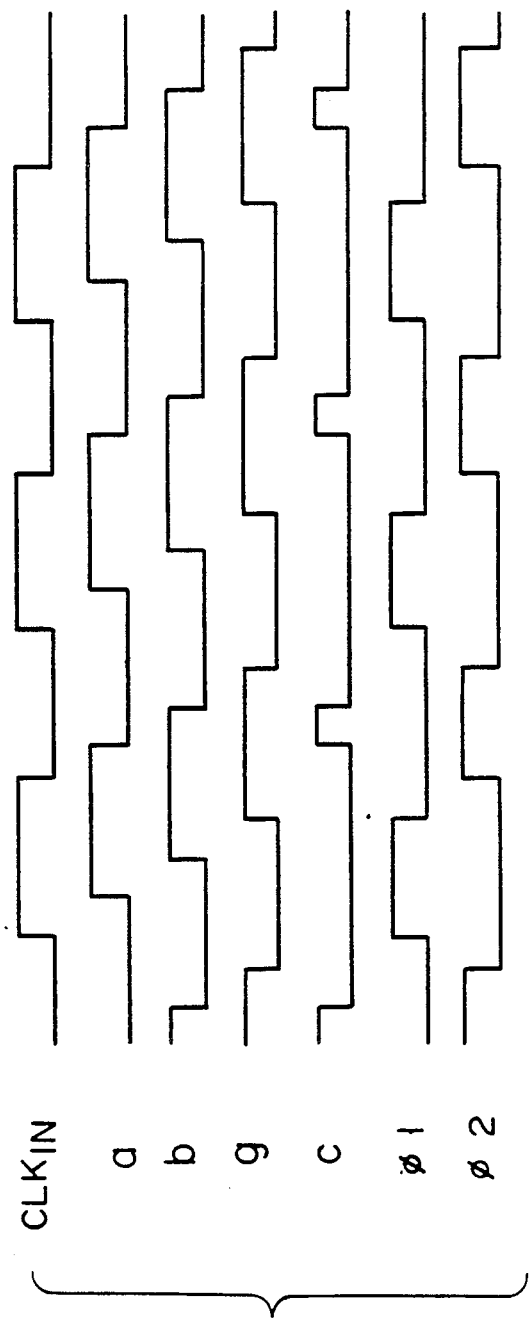
FIG. 14 is a timing chart of the circuit shown in FIG. 13.

FIG. 13 is a circuit diagram showing an arrangement of a clock signal generator according to the third embodiment of the present invention. In the third embodiment, an output logic circuit 8 of the clock signal generator shown in FIG. 11 has an arrangement as shown in FIG. 13. The output logic circuit 8 comprises an inverter 100 for inverting an input clock signal $CLK_{IN}$, an inverter 101 for inverting an output signal from an inverter 43 in a delay stage 36, a NAND gate 102 for receiving the signal $CLK_{IN}$ and the output signal from the inverter 43 in the delay stage 36, an inverter 103 for inverting an output signal from the NAND gate 102, a NAND gate 104 for receiving output signals from the inverters 100 and 101, and an inverter 105 for inverting an output signal from the NAND gate 104. As shown in a timing chart of FIG. 14, the circuit 8 outputs two-phase clock signals $\phi 1$ and $\phi 2$ having the same frequency as that of the signal $CLK_{IN}$.

Also in this embodiment, the input clock signal $CLK_{IN}$ having a predetermined frequency and a delayed output normally controlled to have a predetermined delay amount by a phase-locked loop from each delay stage are supplied to the output logic circuit 8. Therefore, the frequencies of the two-phase clock signals $\phi 1$ and $\phi 2$ output from the output logic circuit 8 are not adversely affected by variations in manufacture conditions or the like but stable.

Also in this embodiment, a multi-phase clock signal of two phases or more can be extracted by increasing the number of delay stages in the delay circuit 4 and changing the arrangement of the logic circuit provided in the output logic circuit 8. In addition, a logic circuit 5 having the arrangement as shown in FIG. 4 can be used to supply the input clock signal $CLK_{IN}$ to the gate of the n-channel MOS transistor 29 and the output signal c from the logic circuit 5 to the gate of the p-channel MOS transistor 28, thereby operating the transistors. All the modifications of the first embodiment shown in FIG. 2 can be applied to this third embodiment.

Figure 15:
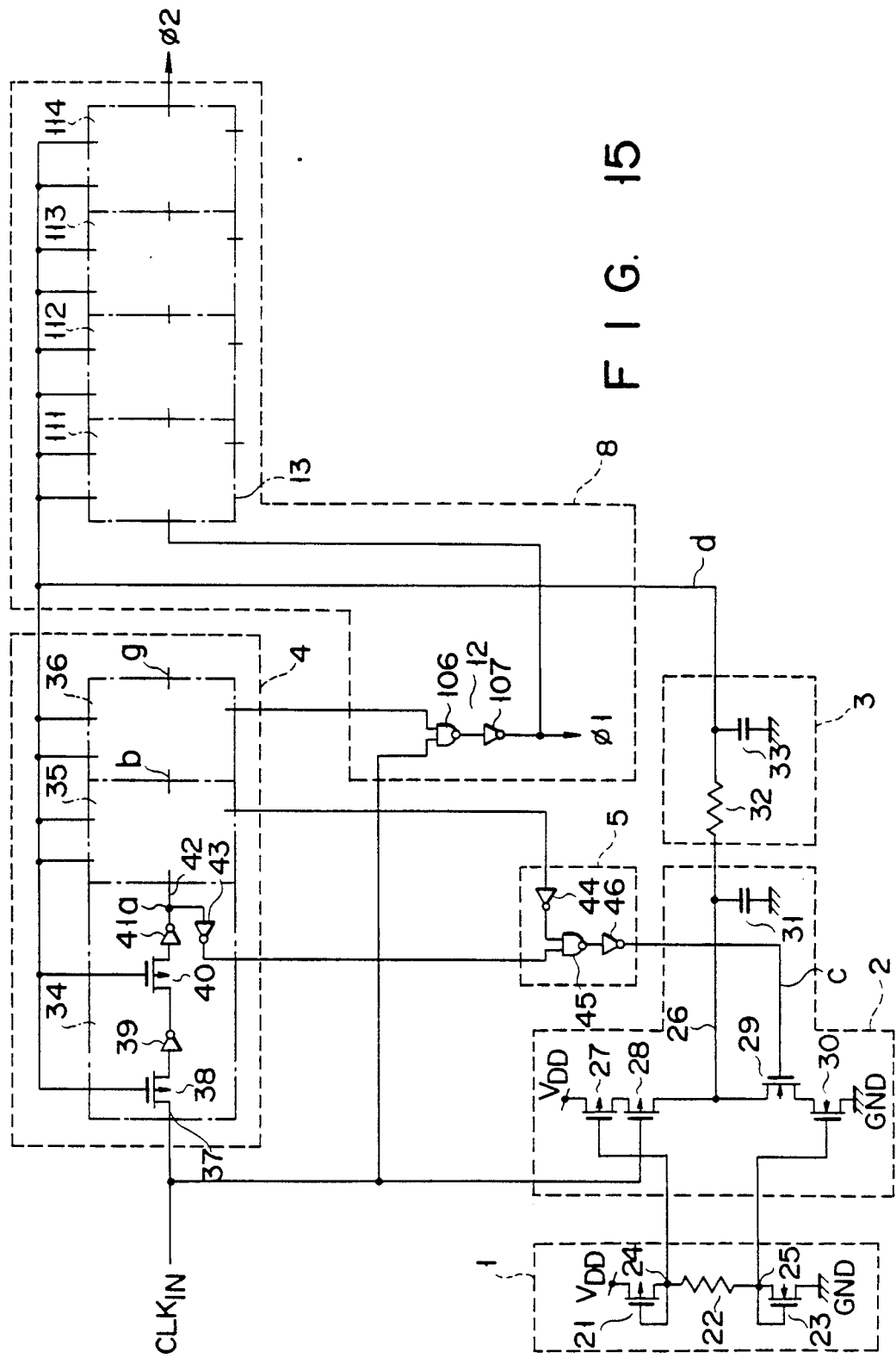
FIG. 15 is a circuit diagram showing an arrangement of a clock signal generator according to the fourth embodiment of the present invention.

FIG. 15 is a circuit diagram showing an arrangement of a clock signal generator according to the fourth embodiment of the present invention. In the fourth embodiment, similar to the clock signal generator shown in FIG. 13, the present invention is applied to a clock signal generator for extracting a two-phase clock signal. In this embodiment, a logic circuit 12 and a delay circuit 13 for receiving an output signal $\phi 1$ from the logic circuit 12 are provided in an output logic circuit 8.

The logic circuit 12 is constituted by a NAND gate 106 for receiving an input clock signal $CLK_{IN}$ and an output signal from an inverter 43 of a delay stage 36 in the delay circuit 4, and an inverter 107 for receiving an output signal from the NAND gate 106. The circuit 12 outputs the clock signal $\phi 1$ of the clock signals shown in the timing chart of FIG. 14.

The delay circuit 13 is constituted by four cascade-connected delay stages 111 to 114 each having the same arrangement as the delay stage in the delay circuit 4 and a delay amount controlled by an output signal d from the low-pass filter 3. An output clock signal φ1 from the logic circuit 12 is supplied to the first delay stage 111 of the delay circuit 13, and the other clock signal φ2 is output from the last delay stage 114.

As in this embodiment, the signal φ2 of two-phase clock signals can also be extracted by delaying the clock signal φ1 by a predetermined time by the delay circuit 13 constituted by using the delay stages each having the same delay amount as that of the delay circuit 4 in a phase-locked loop.

In this embodiment, the delay circuit 13 can also be used to delay a signal by a predetermined time by inputting another input signal to the circuit 13 instead of the clock signal φ1. For example, when $A_2/A_1 = 4$ and the frequency of the input clock signal $CLK_{IN}$ is set to be 1 MHz, each delay stage of the delay circuits 4 and 13 has a delay amount of one period/8 = 125 nS. Therefore, a delay time in the delay circuit 13 is 125 nS × 4 stages = 500 nS. Also in this embodiment, a logic circuit 5 having the arrangement shown in FIG. 4 can be provided to supply the signal $CLK_{IN}$ to the gate of an n-channel MOS transistor 29 and an output signal c from the logic circuit 5 to the gate of a p-channel MOS transistor 28, thereby operating the transistors. All the modifications of the embodiment shown in FIG. 2 can be applied to this embodiment.

Figure 16:
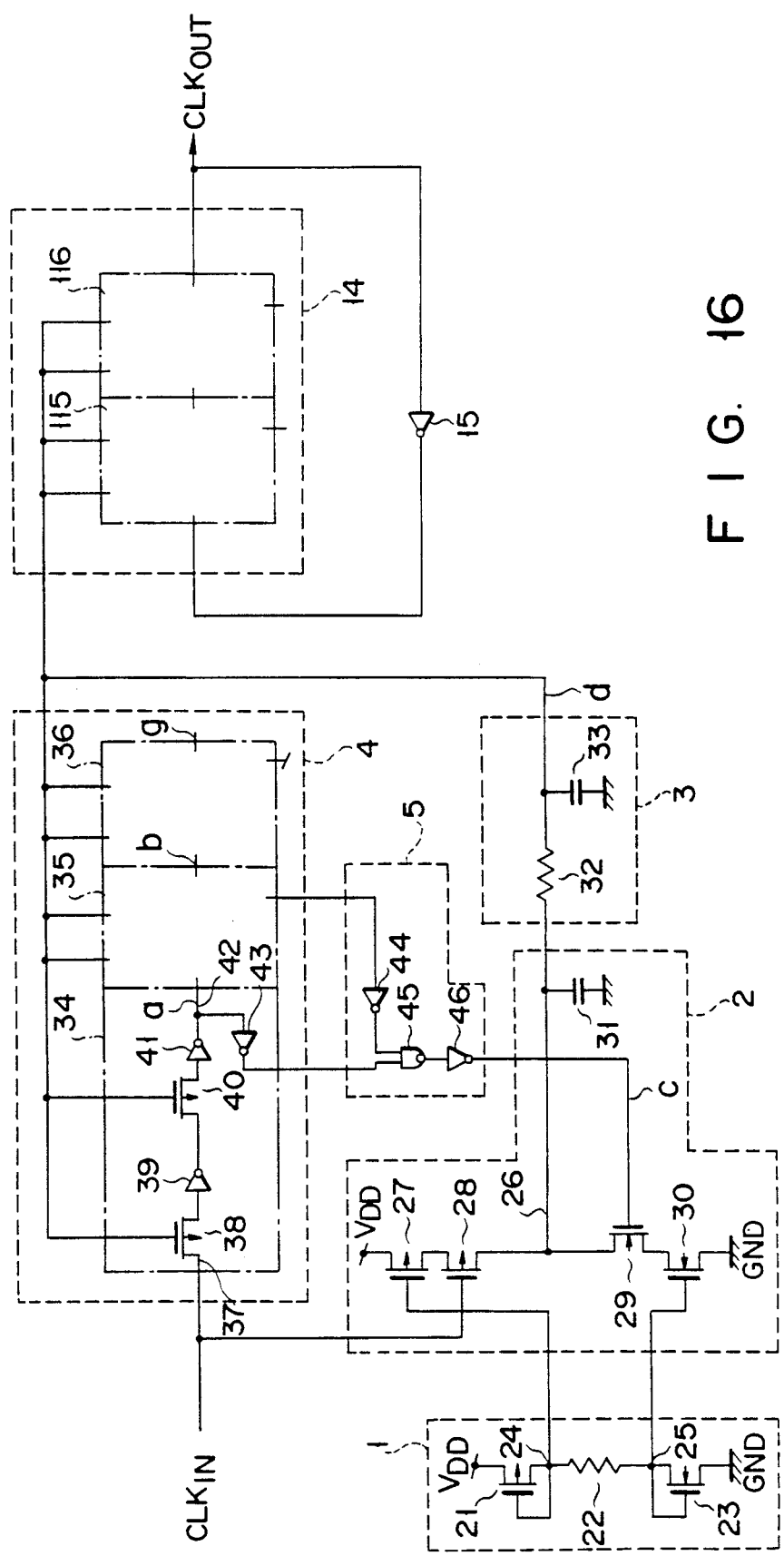
FIG. 16 is a circuit diagram showing an arrangement of a clock signal generator according to the fifth embodiment of the present invention.

FIG. 16 is a circuit diagram showing an arrangement of a clock signal generator according to the fifth embodiment of the present invention. In the fifth embodiment, as the output logic circuit 8 in the clock signal generator shown in FIG. 11, a ring oscillator comprising a delay circuit 14 and an inverter for feeding back an output signal from the delay circuit 14 to the input side of the circuit 14 is arranged.

The delay circuit 14 is constituted by cascade-connecting two delay stages 115 and 116 each having the same arrangement as the delay stage in the delay circuit 4 of the phase-locked loop and a delay amount controlled by an output signal d from the low-pass filter circuit 3.

Figure 17:
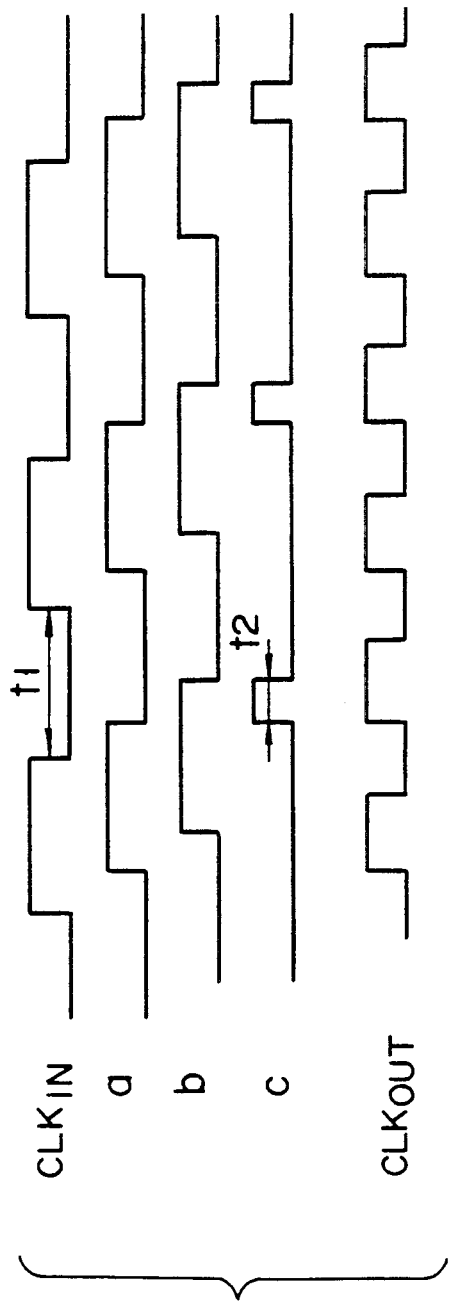
FIG. 17 is a timing chart of the circuit shown in FIG. 16.

In the clock signal generator according to the fifth embodiment, each delay stage in the delay circuits 4 and 14 has a delay amount corresponding to a ⅛ period of the input clock signal $CLK_{IN}$ as described above. In this embodiment, the ratio of $A_2/A_1$ is set to be 4. Therefore, the delay circuit having the two delay stages delays an output signal from the inverter 15 as an input signal by ⅛ period × 2 stages = ¼ period. For this reason, the frequency of an output clock signal $CLK_{OUT}$ from the ring oscillator, i.e., an oscillation frequency f becomes 1/(time corresponding to the ⅛ period of the input clock signal × two stages × 2). That is, the oscillation frequency f is twice the frequency of the input clock signal. FIG. 17 is a timing chart of this embodiment.

According to this embodiment, a clock signal having a frequency twice that of an input clock signal can be extracted. Also in this embodiment, since a delay amount of each delay stage is controlled to be predetermined by a phase-locked loop, the frequency of the output clock signal $CLK_{OUT}$ is adversely affected by variations in manufacturing conditions or the like but can be stabilized. Also in this embodiment, a logic circuit 5 having the arrangement shown in FIG. 4 can be provided to supply the signal $CLK_{IN}$ to the gate of an n-channel MOS transistor 29 and an output signal c from the logic circuit 5 to the gate of a p-channel MOS transistor 28, thereby operating the transistors. All the modifications of the embodiment shown in FIG. 2 can be applied to the fifth embodiment.

FIG. 18 is a circuit diagram showing an arrangement of a clock signal generator according to the sixth embodiment of the present invention. In the sixth embodiment, the ratio of $A_2/A_1$ is set to be 4, an output logic circuit 8 constituted by a delay circuit 16 including two delay stages 117 and 118 and an inverter 17 is additionally provided to the signal delay circuit according to the first embodiment including the reference current set circuit 1, the charge pump circuit 2, the low-pass filter circuit 3, and the delay circuit 4 having the three delay stages.

An arrangement of each delay stage of the delay circuits 4 and 16 of this embodiment differs from that of the first embodiment. That is, in this embodiment, each delay stage comprises a CMOS transmission gate 123 which includes parallel-connected p- and n-channel MOS transistors 121 and 122 and receives a signal from an input node 37, an inverter 124 for inverting an output signal from the transmission gate 123, a CMOS transmission gate 127 which includes parallel-connected p- and n-channel MOS transistors 125 and 126 and receives an output signal from the inverter 124, an inverter 128 for inverting an output signal from the transmission gate 127 and outputting the inverted output signal to an output node 42, and an inverter 129 for inverting a signal from the output node 42.

An output signal d from the low-pass filter circuit 3 is supplied in parallel to the gates of the p-channel MOS transistor sides of the transmission gates of each delay stage in the delay circuits 4 and 16. A predetermined reference voltage Vref is supplied in parallel to the gates of the n-channel MOS transistor sides of the transmission gates of each delay stage in the delay circuit 4. A control voltage Vcont is supplied in parallel to the gates of the n-channel MOS transistor sides of the transmission gates of each delay stage in the delay circuit 16.

In this embodiment, if Vref=Vcont, the conditions given to the transmission gates 123 and 127 of the delay stages in the delay circuits 4 and 16 are the same. Therefore, the output logic circuit 8 operates as a ring oscillator for oscillating a signal having a frequency twice that of an input clock signal $CLK_{IN}$.

When the control voltage Vcont is increased/decreased from the reference voltage Vref, gate bias voltages of the transmission gates 123 and 127 of each delay stage in the delay circuit 16 to which the control voltage Vcont is supplied change to change their transmission characteristics. As a result, a delay amount of each delay stage changes to change its oscillation frequency. This state is shown in a graph of FIG. 19. As is apparent from FIG. 19, a frequency $f_{OUT}$ of an output clock signal $CLK_{OUT}$ obtained when Vref=Vcont becomes $2f_{IN}$ which is twice a frequency $f_{IN}$ of the input clock signal $CLK_{IN}$, and the frequency $f_{OUT}$ changes on the basis of the frequency $2f_{IN}$ when the control voltage Vcont is increased/decreased. Therefore, the clock signal generator of this embodiment operates as a VCO capable of extracting the clock signal $CLK_{OUT}$ having an output frequency corresponding to the control voltage Vcont.

In a conventional VCO, no uniform frequency characteristics can be obtained since values of a resistor or capacitor change due to variations in a manufacturing process. In the above embodiment, however, a frequency twice that of an input frequency can be obtained when Vcont=Vref, i.e., characteristics for allowing passing of a frequency through a predetermined point can always be obtained.

As has been described above, according to the present invention, a delay amount of a delay stage can be precisely controlled by a phase-locked loop. Therefore, a signal delay circuit capable of obtaining a stable delay time regardless of variations in manufacturing conditions can be provided.

In addition, according to the present invention, the above signal delay circuit can be used to provide a clock signal generator capable of generating a clock signal having a stable frequency regardless of variations in manufacturing conditions.

What is claimed is:

1. A signal delay circuit comprising:
   variable delay means for delaying an input signal having a predetermined frequency by a time corresponding to a control signal;
   delay amount detecting means for detecting a signal delay amount of said delay means; and
   a charge pump circuit for receiving the input signal and a detection signal from said delay amount detecting means, generating a DC voltage corresponding to a pulse width ratio between the two signals, and feeding back the DC voltage to said variable delay means as the control signal.

2. A signal delay circuit comprising:
   first delay means, constituted by at least one delay stage having a signal delay time controlled on the basis of a control signal, for delaying an input signal having a predetermined frequency;
   a first logic circuit for detecting a signal delay amount of said first delay means; and
   a charge pump circuit, having a capacitor, for generating a DC voltage by charging and discharging said capacitor with a current of an arbitrary multiple of a reference current on the basis of the input signal and a detection signal from said first logic circuit, and feeding back the DC voltage to said first delay means as the control signal, a power ratio between the charge and discharge currents being set to coincide with a reciprocal of a pulse width ratio between the input signal and the detection signal from said first logic circuit.

3. A circuit according to claim 2, wherein a low-pass filter circuit is inserted between said charge pump circuit and said first delay means.

4. A circuit according to claim 2, wherein one delay stage of said first delay means comprises:
   an input node;
   a first transistor, connected at one terminal thereof to said input node, for receiving the control signal at a gate thereof;
   a first inverter having an input terminal connected to the other terminal of said first transistor;
   a second transistor having the same polarity as said first transistor, connected at one terminal thereof to an output terminal of said first inverter, for receiving the control signal at a gate thereof;
   a second inverter having an input terminal connected to the other terminal of said second transistor;
   an output node connected to an output terminal of said second inverter; and
   a third inverter having an input terminal connected to said output node.

5. A circuit according to claim 2, wherein one delay stage of said first delay means comprises:
   an input node;
   a first CMOS transmission gate connected at one terminal thereof to said input node and constituted by transistors having first and second polarities;
   a first inverter having an input terminal connected to the other terminal of said first transmission gate;
   a second CMOS transmission gate connected at one terminal thereof to an output terminal of said first inverter and constituted by transistors having the first and second polarities;
   a second inverter having an input terminal connected to the other terminal of said second CMOS transmission gate;
   an output node connected to an output terminal of said second inverter; and
   a third inverter having an input terminal connected to said output node,
   wherein said control signal is supplied to gates of said transistors having the first polarity of said first and second CMOS transmission gates, and a predetermined DC voltage is applied to gates of said transistors having the second polarity of said first and second CMOS transmission gates.

6. A circuit according to claim 2, wherein one delay stage of said variable first delay means comprises:
   an input node, an internal node, and an output node;
   first and second transistors of a first polarity, each having a source and a drain inserted in series between a first power source potential and said internal node, and having gates for receiving the control signal and a signal from said input node, respectively;
   a third transistor of a second polarity, having a source and a drain inserted between said internal node and a second power source potential, and a gate for receiving the signal from said input node;
   fourth and fifth transistors of the first polarity, each having a source and a drain inserted in series between the first power source potential and said output node, and having gates for receiving the control signal and the signal from said internal node, respectively;
   a sixth transistor of the second polarity, having a source and a drain between said output node and the second power source potential, and a gate for receiving the signal from said internal node; and
   a first inverter having an input terminal connected to said output node.

7. A circuit according to claim 2, wherein one delay stage of said first delay means comprises:
   an input node and an output node;
   a first inverter having an input terminal connected to said input node;
   first and second transistors of a first polarity, each having a source and a drain inserted in series between a first power source potential and said output node, and having gates for receiving the control signal and an output signal from said first inverter, respectively; and
   a third transistor of a second polarity, having a source and a drain inserted between said output node and a second power source potential, and a gate for receiving an output signal from said first inverter.

8. A circuit according to claim 2, wherein said charge pump circuit comprises:
   an output node for the DC voltage;
   first and second transistors of a first polarity, inserted in series between a first power source potential and said output node, and having gates for receiving a first predetermined reference voltage and an input signal having a predetermined frequency, respectively;

third and fourth transistors of a second polarity, inserted in series between said output node and a second power source potential, and having gates for receiving an output signal from said first logic circuit and a second predetermined reference voltage, respectively; and a capacitor connected to said output node.

9. A circuit according to claim 2, wherein said first logic circuit receives an output signal from at least two delay stages of said first delay means and detects a signal delay amount of each delay stage.

10. A circuit according to claim 2, further comprising a reference voltage generator for generating the first and second reference voltages to be used to set the reference current value in said charge pump circuit.

11. A circuit according to claim 10, wherein said reference voltage generator comprises:

first and second nodes for obtaining the first and second reference voltages, respectively;

a first transistor of a first polarity having a source and a drain inserted between a first power source potential and said first node, and a gate connected to said first node;

a second transistor of a second polarity having a source and a drain inserted between a second power source potential and said second node, and a gate connected to said second node; and a resistor connected between said first and second nodes.

12. A circuit according to claim 2, wherein in said charge pump circuit, the charge or discharge current value is arbitrarily controlled in accordance with an external control signal.

13. A circuit according to claim 12, wherein said charge pump circuit comprises:

an output node for the DC voltage;

first and second transistors of a first polarity, inserted in series between a first power source potential and said output node, and having gates for receiving a first predetermined reference voltage and the input signal having a predetermined frequency, respectively;

third and fourth transistors of a second polarity, inserted in series between said output node and a second power source potential, and having gates for receiving a signal obtained by logically ANDing an output signal from said first logic circuit and an external first select signal and a second predetermined reference voltage, respectively;

fifth and sixth transistors, inserted in series between said output node and the second power source potential, and having gates for receiving a signal obtained by logically ANDing the output signal from said first logic circuit and a second external select signal and a second predetermined reference voltage, respectively; and a capacitor connected to said output node.

14. A circuit according to claim 2, wherein a level converter for reducing a voltage change range of an output signal from said charge pump circuit is inserted between said charge pump circuit and said first delay means.

15. A circuit according to claim 14, wherein said level converter comprises:

a first inverter for receiving an output signal from said charge pump circuit; and a second inverter of a source follower type for receiving an output signal from said first inverter.

16. A clock signal generator comprising:

first delay means, constituted by at least one delay stage having a signal delay time controlled on the basis of a control signal, for delaying an input signal having a predetermined frequency;

a first logic circuit for detecting a signal delay amount of said first delay means;

a charge pump circuit, having a capacitor, for generating a DC voltage by charging and discharging said capacitor with a current of an arbitrary multiple of a reference current on the basis of said input signal and a detection signal from said first logic circuit, and feeding back the DC voltage to said first delay means as the control signal, a power ratio between the charge and discharge currents being set to coincide with a reciprocal of a pulse width ratio between the input signal and the detection signal from said first logic circuit; and a second logic circuit for receiving a delayed output signal from at least said first delay means, and generating a clock signal having a frequency different from the frequency of the input signal on the basis of the delayed output signal.

17. A generator according to claim 16, wherein said second logic circuit receives the delayed output signal from said first delay means and the input signal, and generates a clock signal having a frequency higher than the frequency of the input signal.

18. A generator according to claim 16, wherein said second logic circuit generates a signal having a frequency which is an integer multiple of the frequency of the input signal as the clock signal.

19. A generator according to claim 18, wherein a low-pass filter circuit is inserted between said charge pump circuit and said first delay means.

20. A generator according to claim 18, wherein one delay stage of said first delay means comprises:

an input node;

a first transistor, connected at one terminal thereof to said input node, for receiving the control signal at a gate thereof;

a first inverter having an input terminal connected to the other terminal of said first transistor;

a second transistor having the same polarity as said first transistor, connected at one terminal thereof to an output terminal of said first inverter, for receiving the control signal at a gate thereof;

a second inverter having an input terminal connected to the other terminal of said second transistor;

an output node connected to an output terminal of said second inverter; and a third inverter having an input terminal connected to said output node.

21. A generator according to claim 18, wherein one delay stage of said first delay means comprises:

an input node;

a first CMOS transmission gate connected at one terminal thereof to said input node and constituted by transistors having first and second polarities;

a first inverter having an input terminal connected to the other terminal of said first transmission gate;

a second CMOS transmission gate connected at one terminal thereof to an output terminal of said first inverter and constituted by transistors having the first and second polarities;

a second inverter having an input terminal connected to the other terminal of said second CMOS transmission gate;

an output node connected to an output terminal of said second inverter; and a third inverter having an input terminal connected to said output node, wherein said control signal is supplied to gates of said transistors having the first polarity of said first and second CMOS transmission gates, and a predetermined DC voltage is applied to gates of said transistors having the second polarity of said first and second CMOS transmission gates.

22. A generator according to claim 18, wherein one delay stage of said first delay means comprises:

an input node, an internal node, and an output node;

first and second transistors of a first polarity, each having a source and a drain inserted in series between a first power source potential and said internal node, and having gates for receiving the control signal and a signal from said input node, respectively;

a third transistor of a second polarity, having a source and a drain inserted between said internal node and a second power source potential, and a gate for receiving the signal from said input node;

fourth and fifth transistors of the first polarity, each having a source and a drain inserted in series between the first power source potential and said output node, and having gates for receiving the control signal and the signal from said internal node, respectively;

a sixth transistor of the second polarity, having a source and a drain between said output node and the second power source potential, and a gate for receiving the signal from said internal node; and a first inverter having an input terminal connected to said output node.

23. A generator according to claim 18, wherein one delay stage of said first delay means comprises:

an input node and an output node;

a first inverter having an input terminal connected to said input node;

first and second transistors of a first polarity, each having a source and a drain inserted in series between a first power source potential and said output node, and having gates for receiving the control signal and an output signal from said first inverter, respectively; and a third transistor of a second polarity, having a source and a drain inserted between said output node and a second power source potential, and a gate for receiving an output signal from said first inverter.

24. A generator according to claim 18, wherein said charge pump circuit comprises:

an output node for the DC voltage;

first and second transistors of a first polarity, inserted in series between a first power source potential and said output node, and having gates for receiving a first predetermined reference voltage and an input signal having a predetermined frequency, respectively;

third and fourth transistors of a second polarity, inserted in series between said output node and a second power source potential, and having gates for receiving an output signal from said first logic circuit and a second predetermined reference voltage, respectively; and a capacitor connected to said output node.

25. A generator according to claim 18, wherein said first logic circuit receives an output signal from at least two delay stages of said first delay means and detects a signal delay amount of each delay stage.

26. A generator according to claim 18, further comprising a reference voltage generator for generating the first and second reference voltages to be used to set the reference current value in said charge pump circuit.

27. A generator according to claim 26, wherein said reference voltage generator comprises:

first and second nodes for obtaining the first and second reference voltages, respectively;

a first transistor of a first polarity having a source and a drain inserted between a first power source potential and said first node, and a gate connected to said first node;

a second transistor of a second polarity having a source and a drain inserted between a second power source potential and said second node, and a gate connected to said second node; and a resistor connected between said first and second nodes.

28. A generator according to claim 16, wherein said second logic circuit generates a multi-phase clock signal.

29. A generator according to claim 28, wherein a low-pass filter circuit is inserted between said charge pump circuit and said first delay means.

30. A generator according to claim 28, wherein one delay stage of said first delay means comprises:

an input node;

a first transistor, connected at one terminal thereof to said input node, for receiving the control signal at a gate thereof;

a first inverter having an input terminal connected to the other terminal of said first transistor;

a second transistor having the same polarity as said first transistor, connected at one terminal thereof to an output terminal of said first inverter, for receiving the control signal at a gate thereof;

a second inverter having an input terminal connected to the other terminal of said second transistor;

an output node connected to an output terminal of said second inverter; and a third inverter having an input terminal connected to said output node.

31. A generator according to claim 28, wherein one delay stage of said first delay means comprises:

an input node;

a first CMOS transmission gate connected at one terminal thereof to said input node and constituted by transistors having first and second polarities;

a first inverter having an input terminal connected to the other terminal of said first transmission gate;

a second CMOS transmission gate connected at one terminal thereof to an output terminal of said first inverter and constituted by transistors having the first and second polarities;

a second inverter having an input terminal connected to the other terminal of said second CMOS transmission gate;

an output node connected to an output terminal of said second inverter; and a third inverter having an input terminal connected to said output node, wherein said control signal is supplied to gates of said transistors having the first polarity of said first and second CMOS transmission gates, and a predetermined DC voltage is applied to gates of said transistors having the second polarity of said first and second CMOS transmission gates.

32. A generator according to claim 28, wherein one delay stage of said first delay means comprises:
an input node, an internal node, and an output node;
first and second transistors of a first polarity, each having a source and a drain inserted in series between a first power source potential and said internal node, and having gates for receiving the control signal and a signal from said input node, respectively;
a third transistor of a second polarity, having a source and a drain inserted between said internal node and a second power source potential, and a gate for receiving the signal from said input node;
fourth and fifth transistors of the first polarity, each having a source and a drain inserted in series between the first power source potential and said output node, and having gates for receiving the control signal and the signal from said internal node, respectively;
a sixth transistor of the second polarity, having a source and a drain between said output node and the second power source potential, and a gate for receiving the signal from said internal node; and
a first inverter having an input terminal connected to said output node.

33. A generator according to claim 28, wherein one delay stage of said first delay means comprises:
an input node and an output node;
a first inverter having an input terminal connected to said input node;
first and second transistors of a first polarity, each having a source and a drain inserted in series between a first power source potential and said output node, and having gates for receiving the control signal and an output signal from said first inverter, respectively; and
a third transistor of a second polarity, having a source and a drain inserted between said output node and a second power source potential, and a gate for receiving an output signal from said first inverter.

34. A generator according to claim 28, wherein said charge pump circuit comprises:
an output node for the DC voltage;
first and second transistors of a first polarity, inserted in series between a first power source potential and said output node, and having gates for receiving a first predetermined reference voltage and an input signal having a predetermined frequency, respectively;
third and fourth transistors of a second polarity, inserted in series between said output node and a second power source potential, and having gates for receiving an output signal from said first logic circuit and a second predetermined reference voltage, respectively; and
a capacitor connected to said output node.

35. A generator according to claim 28, wherein said first logic circuit receives an output signal from at least two delay stages of said first delay means and detects a signal delay amount of each delay stage.

36. A generator according to claim 28, further comprising a reference voltage generator for generating the first and second reference voltages to be used to set the reference current value in said charge pump circuit.

37. A generator according to claim 36, wherein said reference voltage generator comprises:
first and second nodes for obtaining the first and second reference voltages, respectively;
a first transistor of a first polarity having a source and a drain inserted between a first power source potential and said first node, and a gate connected to said first node;
a second transistor of a second polarity having a source and a drain inserted between a second power source potential and said second node, and a gate connected to said second node; and
a resistor connected between said first and second nodes.

38. A clock signal generator comprising:
first delay means, constituted by at least one delay stage having a signal delay time controlled on the basis of a control signal, for delaying an input signal having a predetermined frequency;
a first logic circuit for detecting a signal delay amount of said first delay means;
a charge pump circuit, having a capacitor, for generating a DC voltage by charging and discharging said capacitor with a current of an arbitrary multiple of a reference current on the basis of the input signal and a detection signal from said first logic circuit, and feeding back the DC voltage to said first delay means as the control signal, a power ratio between the charge and discharge currents being set to coincide with a reciprocal of a pulse width ratio between the input signal and a detection signal from said first logic circuit;
a second logic circuit for receiving a delayed output signal from at least said first delay means, and generating a clock signal having a frequency different from the frequency of the input signal; and
second delay means, constituted by at least one delay stage having the same arrangement as said delay stage of said first delay means and having a signal delay time controlled on the basis of a control signal generated by said charge pump circuit, for receiving an output signal from said second logic circuit.

39. A generator according to claim 38, wherein a low-pass filter circuit is inserted between said charge pump circuit and said first delay means.

40. A generator according to claim 38, wherein one delay stage of said first delay means comprises:
an input node;
a first transistor, connected at one terminal thereof to said input node, for receiving the control signal at a gate thereof;
a first inverter having an input terminal connected to the other terminal of said first transistor;
a second transistor having the same polarity as said first transistor, connected at one terminal thereof to an output terminal of said first inverter, for receiving the control signal at a gate thereof;
a second inverter having an input terminal connected to the other terminal of said second transistor;
an output node connected to an output terminal of said second inverter; and
a third inverter having an input terminal connected to said output node.

41. A generator according to claim 38, wherein one delay stage of said first delay means comprises:

an input node;

a first CMOS transmission gate connected at one terminal thereof to said input node and constituted by transistors having first and second polarities;

a first inverter having an input terminal connected to the other terminal of said first transmission gate;

a second CMOS transmission gate connected at one terminal thereof to an output terminal of said first inverter and constituted by transistors having the first and second polarities;

a second inverter having an input terminal connected to the other terminal of said second CMOS transmission gate;

an output node connected to an output terminal of said second inverter; and a third inverter having an input terminal connected to said output node, wherein said control signal is supplied to gates of said transistors having the first polarity of said first and second CMOS transmission gates, and a predetermined DC voltage is applied to gates of said transistors having the second polarity of said first and second CMOS transmission gates.

42. A generator according to claim 38, wherein one delay stage of said first delay means comprises:

an input node, an internal node, and an output node;

first and second transistors of a first polarity, each having a source and a drain inserted in series between a first power source potential and said internal node, and having gates for receiving the control signal and a signal from said input node, respectively;

a third transistor of a second polarity, having a source and a drain inserted between said internal node and a second power source potential, and a gate for receiving the signal from said input node;

fourth and fifth transistors of the first polarity, each having a source and a drain inserted in series between the first power source potential and said output node, and having gates for receiving the control signal and the signal from said internal node, respectively;

a sixth transistor of the second polarity, having a source and a drain between said output node and the second power source potential, and a gate for receiving the signal from said internal node; and a first inverter having an input terminal connected to said output node.

43. A generator according to claim 38, wherein one delay stage of said first delay means comprises:

an input node and an output node;

a first inverter having an input terminal connected to said input node;

first and second transistors of a first polarity, each having a source and a drain inserted in series between a first power source potential and said output node, and having gates for receiving the control signal and an output signal from said first inverter, respectively; and a third transistor of a second polarity, having a source and a drain inserted between said output node and a second power source potential, and a gate for receiving an output signal from said first inverter.

44. A generator according to claim 38, wherein said charge pump circuit comprises:

an output node for the DC voltage;

first and second transistors of a first polarity, inserted in series between a first power source potential and said output node, and having gates for receiving a first predetermined reference voltage and an input signal having a predetermined frequency, respectively;

third and fourth transistors of a second polarity, inserted in series between said output node and a second power source potential, and having gates for receiving an output signal from said first logic circuit and a second predetermined reference voltage (Vn), respectively; and a capacitor connected to said output node.

45. A generator according to claim 38, wherein said first logic circuit receives an output signal from at least two delay stages of said first delay means and detects a signal delay amount of each delay stage.

46. A generator according to claim 38, further comprising a reference voltage generator for generating the first and second reference voltages to be used to set the reference current value in said charge pump circuit.

47. A generator according to claim 46, wherein said reference voltage generator comprises:

first and second nodes for obtaining the first and second reference voltages, respectively;

a first transistor of a first polarity having a source and a drain inserted between a first power source potential and said first node, and a gate connected to said first node;

a second transistor of a second polarity having a source and a drain inserted between a second power source potential and said second node, and a gate connected to said second node; and a resistor connected between said first and second nodes.

48. A clock signal generator comprising:

first delay means, constituted by at least one delay stage having a signal delay time controlled on the basis of a control signal, for delaying an input signal having a predetermined frequency;

a first logic circuit for detecting a signal delay amount of said first delay means;

a charge pump circuit, having a capacitor, for generating a DC voltage by charging and discharging said capacitor with a current of an arbitrary multiple of a reference current on the basis of the input signal and a detection signal from said first logic circuit, and feeding back the DC voltage to said first delay means as the control signal, a power ratio between the charge and discharge currents being set to coincide with a reciprocal of a pulse width ratio between the input signal and the detection signal from said first logic circuit;

second delay means constituted by at least one delay stage having the same arrangement as said delay stage in said first delay means and having a signal delay time controlled on the basis of the control signal generated by said charge pump circuit; and feedback means for feeding back an output signal from said second delay means to an input side thereof.

49. A generator according to claim 48, wherein a low-pass filter circuit is inserted between said charge pump circuit and said first delay means.

50. A generator according to claim 48, wherein one delay stage of said first delay means comprises:

an input node;

a first transistor, connected at one terminal thereof to said input node, for receiving the control signal at a gate thereof;

a first inverter having an input terminal connected to the other terminal of said first transistor;

a second transistor having the same polarity as said first transistor, connected at one terminal thereof to an output terminal of said first inverter, for receiving the control signal at a gate thereof;

a second inverter having an input terminal connected to the other terminal of said second transistor;

an output node connected to an output terminal of said second inverter; and a third inverter having an input terminal connected to said output node.

51. A generator according to claim 48, wherein one delay stage of said first delay means comprises:

an input node;

a first CMOS transmission gate connected at one terminal thereof to said input node and constituted by transistors having first and second polarities;

a first inverter having an input terminal connected to the other terminal of said first transmission gate;

a second CMOS transmission gate connected at one terminal thereof to an output terminal of said first inverter and constituted by transistors having the first and second polarities;

a second inverter having an input terminal connected to the other terminal of said second CMOS transmission gate;

an output node connected to an output terminal of said second inverter; and a third inverter having an input terminal connected to said output node, wherein said control signal is supplied to gates of said transistors having the first polarity of said first and second CMOS transmission gates, and a predetermined DC voltage is applied to gates of said transistors having the second polarity of said first and second CMOS transmission gates.

52. A generator according to claim 48, wherein one delay stage of said first delay means comprises:

an input node, an internal node, and an output node;

first and second transistors of a first polarity, each having a source and a drain inserted in series between a first power source potential and said internal node, and having gates for receiving the control signal and a signal from said input node, respectively;

a third transistor of a second polarity, having a source and a drain inserted between said internal node and a second power source potential, and a gate for receiving the signal from said input node;

fourth and fifth transistors of the first polarity, each having a source and a drain inserted in series between the first power source potential and said output node, and having gates for receiving the control signal and the signal from said internal node, respectively;

a sixth transistor of the second polarity, having a source and a drain between said output node and the second power source potential, and a gate for receiving the signal from said internal node; and a first inverter having an input terminal connected to said output node.

53. A generator according to claim 48, wherein one delay stage of said first delay means comprises:

an input node and an output node;

a first inverter having an input terminal connected to said input node;

first and second transistors of a first polarity, each having a source and a drain inserted in series between a first power source potential and said output node, and having gates for receiving the control signal and an output signal from said first inverter, respectively; and a third transistor of a second polarity, having a source and a drain inserted between said output node and a second power source potential, and a gate for receiving an output signal from said first inverter.

54. A generator according to claim 48, wherein said charge pump circuit comprises:

an output node for the DC voltage;

first and second transistors of a first polarity, inserted in series between a first power source potential and said output node, and having gates for receiving a first predetermined reference voltage and an input signal having a predetermined frequency, respectively;

third and fourth transistors of a second polarity, inserted in series between said output node and a second power source potential, and having gates for receiving an output signal from said first logic circuit and a second predetermined reference voltage, respectively; and a capacitor connected to said output node.

55. A generator according to claim 48, wherein said first logic circuit receives an output signal from at least two delay stages of said first delay means and detects a signal delay amount of each delay stage.

56. A generator according to claim 48, further comprising a reference voltage generator for generating the first and second reference voltages to be used to set the reference current value in said charge pump circuit.

57. A generator according to claim 56, wherein said reference voltage generator comprises:

first and second nodes for obtaining the first and second reference voltages, respectively;

a first transistor of a first polarity having a source and a drain inserted between a first power source potential and said first node, and a gate connected to said first node;

a second transistor of a second polarity having a source and a drain inserted between a second power source potential and said second node, and a gate connected to said second node; and a resistor connected between said first and second nodes.

58. A clock signal generator comprising:

first delay means, including at least one stage of cascade-connected delay stages, each of said delay stages being constituted by an input node, a first CMOS transmission gate connected at one terminal thereof to said input node and having transistors of first and second polarities, said transistor of the first polarity having a gate for receiving a control signal, and said transistor of the second polarity having a gate for receiving a reference voltage signal, a first inverter having an input terminal connected to the other terminal of said first transmission gate, a second CMOS transmission gate connected at one terminal thereof to an output terminal of said first inverter and having transistors of the first and second polarities, the control signal being supplied to a gate of said transistor of the first polarity, and the reference voltage signal being supplied to a gate of said transistor of the second polarity, a second inverter having an input terminal connected to the other terminal of said second CMOS transmission gate, an output node connected to an output terminal of said second inverter, and a third inverter having an input terminal connected to said output node, said first delay means being connected to delay an input signal having a predetermined frequency;

a first logic circuit for detecting a signal delay amount of said first delay means;

a charge pump circuit, having a capacitor, for generating a DC voltage by charging and discharging said capacitor with a current of an arbitrary multiple of a reference current on the basis of the input signal and a detection signal from said first logic circuit, and feeding back the DC voltage to said first delay means as the control signal, a power ratio between the charge and discharge currents being set to coincide with a reciprocal of a pulse width ratio between the input signal and a detection signal of said first logic circuit;

second delay means, including at least one stage of cascade-connected delay stages, each of said delay stages being constituted by an input node, a third CMOS transmission gate connected at one terminal thereof to said input node and having transistors of the first and second polarities, said transistor of the first polarity having a gate for receiving a control signal generated by said charge pump circuit, and said transistor of the second polarity having a gate for receiving an oscillation frequency control voltage signal, a fourth inverter having an input terminal connected to the other terminal of said third transmission gate, a fourth CMOS transmission gate connected at one terminal thereof to an output terminal of said fourth inverter and having transistors of the first and second polarities, the control signal generated by said charge pump circuit being supplied to a gate of said transistor of the first polarity, and the oscillation frequency control voltage signal being supplied to a gate of said transistor of the second polarity, a fifth inverter having an input terminal connected to the other terminal of said fourth CMOS transmission gate, and an output node connected to an output terminal of said fifth inverter; and feedback means for feeding back an output signal from said second delay means to an input side thereof.

59. A generator according to claim 58, wherein said feedback means is constituted by an inverter.

60. A generator according to claim 58, wherein a low-pass filter circuit is inserted between said charge pump circuit and said first delay means.

61. A generator according to claim 58, wherein said charge pump circuit comprises:

an output node for the DC voltage;

first and second transistors of a first polarity, inserted in series between a first power source potential and said output node, and having gates for receiving a first predetermined reference voltage and an input signal having a predetermined frequency, respectively;

third and fourth transistors of a second polarity, inserted in series between said output node and a second power source potential, and having gates for receiving an output signal from said first logic circuit and a second predetermined reference voltage, respectively; and a capacitor connected to said output node.

62. A generator according to claim 58, wherein said first logic circuit receives an output signal from at least two delay stages of said first delay means and detects a signal delay amount of each delay stage.

63. A generator according to claim 58, further comprising a reference voltage generator for generating the first and second reference voltages to be used to set the reference current value in said charge pump circuit.

64. A generator according to claim 63, wherein said reference voltage generator comprises:

first and second nodes for obtaining the first and second reference voltages, respectively;

a first transistor of a first polarity having a source and a drain inserted between a first power source potential and said first node, and a gate connected to said first node;

a second transistor of a second polarity having a source and a drain inserted between a second power source potential and said second node, and a gate connected to said second node; and a resistor connected between said first and second nodes.

* * * * *